United States Patent
Ogihara et al.

(10) Patent No.: US 7,642,043 B2
(45) Date of Patent: Jan. 5, 2010

(54) REWORK PROCESS FOR PHOTORESIST FILM

(75) Inventors: Tsutomu Ogihara, Niigata (JP); Takafumi Ueda, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 471 days.

(21) Appl. No.: 11/544,552

(22) Filed: Oct. 10, 2006

(65) Prior Publication Data

US 2007/0111134 A1 May 17, 2007

(30) Foreign Application Priority Data

Nov. 16, 2005 (JP) ............................. 2005-331886

(51) Int. Cl.
G03F 1/00 (2006.01)
G03F 7/00 (2006.01)
G03F 7/004 (2006.01)

(52) U.S. Cl. ................. 430/331; 430/270.1; 430/272.1; 430/311; 430/312; 510/175

(58) Field of Classification Search .............. 430/270.1, 430/272.1, 311, 312, 331; 510/175
See application file for complete search history.

(56) References Cited

U.S. PATENT DOCUMENTS

| | | | |
|---|---|---|---|
| 5,286,607 A | 2/1994 | Brown | |
| 6,191,046 B1 * | 2/2001 | Singh et al. | 438/723 |
| 6,340,734 B1 * | 1/2002 | Lin et al. | 528/15 |
| 6,720,133 B1 * | 4/2004 | Ramsbey et al. | 430/312 |
| 7,456,141 B2 * | 11/2008 | Hsu et al. | 510/175 |
| 2002/0095018 A1 | 7/2002 | Baldwin et al. | |
| 2004/0191479 A1 * | 9/2004 | Hatakeyama et al. | 428/141 |
| 2004/0220066 A1 * | 11/2004 | Rutter, Jr. | 510/175 |
| 2005/0112383 A1 | 5/2005 | Tanaka et al. | |
| 2007/0225188 A1 * | 9/2007 | Wang | 510/175 |

FOREIGN PATENT DOCUMENTS

| | | |
|---|---|---|
| FR | 2 773 813 A | 7/1999 |
| JP | A-2005-048152 | 2/2005 |

OTHER PUBLICATIONS

J. M. Moran et al., "High Resolution, Steep Profile Resist Patterns," Bell Laboratories Murray Hill, New Jersey, J. Vac. Sci. Technolo., 16 (6), Nov./ Dec. 1979.

* cited by examiner

Primary Examiner—Amanda C. Walke
(74) Attorney, Agent, or Firm—Oliff & Berridge, PLC

(57) ABSTRACT

There is disclosed a rework process for a photoresist film over a substrate having at least an antireflection silicone resin film and the photoresist film over the silicone resin film comprising: at least
  removing the photoresist film with a solvent while leaving the silicone resin film unremoved; and
  forming a photoresist film again over the silicone resin film. In this case, the substrate over which the photoresist film is reworked can have an organic film under the silicone resin film. There can be provided a rework process for a photoresist film that can be conducted more easily at lower cost.

21 Claims, 3 Drawing Sheets

(a)

(b)

(c)

(a)

(b)

(c)

(d)

(a)

(b)

(c)

REWORK PROCESS FOR PHOTORESIST FILM

BACKGROUND OF THE INVENTION

1. Field of the Invention

The present invention relates to a rework process for a photoresist film over a substrate having an antireflection silicone resin film and a photoresist film over the silicone resin film.

2. Description of the Related Art

With a tendency of realizing high integration and high-speed of LSI, a finer pattern rule has been demanded in recent years. The lithography technique with optical exposure, which is used for general purpose at present, is reaching an inherent limiting resolution derived from a wavelength of a light source.

There is widely used optical exposure using g line (436 nm) or i line (365 nm) of a mercury-vapor lamp as a light source for lithography when a resist pattern is formed. It has been considered that a method of using an exposure light with a shorter wavelength is effective as a means for obtaining a further finer pattern. For this reason, for example KrF excimer laser (248 nm) with a short wavelength is used as an exposure light source instead of i line (365 nm) for mass-production process of a 64 M bit DRAM processing method. However, a light source with far shorter wavelength is needed to manufacture DRAM with integrity of 1 G or more which needs still finer processing techniques (for example, a processing size is 0.13 µm or less). Accordingly, lithography with ArF excimer laser (193 nm) has been particularly examined.

There is a multilayer-resist process to form a pattern on a substrate with such lithography techniques.

For example, to prevent deterioration of a resist pattern due to halation or a standing wave, a method of providing an Anti-Reflecting Coating between a substrate and a photoresist film is known.

Furthermore, to form a pattern with a high aspect ratio on a stepped substrate, a method of using a substrate with an organic film thereon, a silicon-containing film thereon, and a photoresist film thereon is known (for example, see J. Vac. Sci. Technol., 16(6), November/December 1979).

In view of enhancing resolution, a thinner photoresist film is desirable. On the other hand, in view of obtaining good embedding characteristics for substrate steps and high etching resistance when a substrate is etched, a thicker photoresist film is desirable. Then, three stacked layers can have a layer with good embedding characteristics for substrate steps and high dry etching resistance; and a layer with high resolution, separately. Consequently, it becomes possible to form a pattern with a high aspect ratio on a stepped substrate.

As the silicon-containing film, for example, a Spin On Glass (SOG) film is used. Many SOG films have been suggested.

To form a pattern on such a substrate, first, the pattern circuit area of a photoresist film is exposed and then developed with a developer to form a resist pattern on the photoresist film. Second, a pattern is formed on an antireflection film or an SOG film by using the photoresist film as a mask. In this way, the resist pattern is transferred sequentially, and finally, a pattern is formed on a substrate.

In the above process, formation of a resist pattern can fail because striation is generated when a resist solution is applied, or deviation is generated in the resist pattern after exposure. In such a case of failure, transferring a pattern down to a substrate with the deviated resist pattern produces a failed substrate and also wastes time and manpower expended for producing the substrate.

Then, when formation of a resist pattern fails, the so-called rework process for a photoresist film is conducted as follows: A photoresist film with a deviated resist pattern and an antireflection film or an SOG film under the photoresist film are removed. Then again, an antireflection film or an SOG film is formed, and a photoresist film is further formed thereon.

However, such a conventional rework process for a photoresist film has problems that it is cumbersome and it costs too much.

SUMMARY OF THE INVENTION

The present invention has been accomplished to solve the above-mentioned problems, and an object of the present invention is to provide a rework process for a photoresist film that can be conducted more easily at lower cost.

To solve the above-mentioned problems, the present invention provides a rework process for a photoresist film over a substrate having at least an antireflection silicone resin film and the photoresist film over the silicone resin film comprising: at least removing the photoresist film with a solvent while leaving the silicone resin film unremoved; and forming a photoresist film again over the silicone resin film.

In this way, when the photoresist film is removed with a solvent while leaving the silicone resin film unremoved and a photoresist film is formed again over the silicone resin film, it is not necessary to remove the silicone resin film. Consequently, the photoresist film can be reworked more easily at lower cost than before.

In the rework process for a photoresist film according to the present invention, it is preferable that the antireflection silicone resin film has cross-links between side chains of the silicone resin, between a side chain and a silanol group of the silicone resin, or both between side chains of the silicone resin and between a side chain and a silanol group of the silicone resin.

In this case, it is preferable that the silicone resin film has the cross-links formed by any one or more of a crosslinkable hydroxy group and a crosslinkable epoxy group in a side chain of the silicone resin.

As mentioned above, when the antireflection silicone resin film has cross-links between side chains of the silicone resin, between a side chain and a silanol group of the silicone resin, or both between side chains of the silicone resin and between a side chain and a silanol group of the silicone resin, a more excellent resist pattern can be formed on the re-formed photoresist film over the silicone resin film.

In the rework process for a photoresist film according to the present invention, it is preferable that the solvent for removing the photoresist film contains 50 mass % or more of a compound selected from the group consisting of a propylene glycol alkyl ether derivative and a saturated alkyl ketone having 5 or more carbon atoms; or 50 mass % or more in total of two or more compounds selected from the group consisting of a propylene glycol alkyl ether derivative and a saturated alkyl ketone having 5 or more carbon atoms.

In this case, it is possible that the propylene glycol alkyl ether derivative is any one or more compound(s) selected from the group consisting of propylene glycol methyl ether and propylene glycol methyl ether acetate. It is possible that the saturated alkyl ketone having 5 or more carbon atoms is any one or more compound(s) selected from the group consisting of cyclopentanone, cyclohexanone, and 5-methyl-2-hexanone.

By using the solvent containing 50 mass % or more of a compound selected from the group consisting of a propylene glycol alkyl ether derivative and a saturated alkyl ketone having 5 or more carbon atoms; or 50 mass % or more in total of two or more compounds selected from the group consisting of a propylene glycol alkyl ether derivative and a saturated alkyl ketone having 5 or more carbon atoms, only the photoresist film can be removed more handily with hardly damaging the silicone resin film thereunder.

In the rework process for a photoresist film according to the present invention, the substrate over which the photoresist film is reworked has optionally an organic film under the silicone resin film.

In recent years, a patterning process for a substrate with an organic film, an antireflection silicone resin film thereon, and a photoresist film thereon has been investigated. The rework process for a photoresist film according to the present invention is applicable to reworking a photoresist film of such a substrate.

Furthermore, the present invention provides a patterning process comprising: at least forming a photoresist film again over the silicone resin film by the rework process according to the present invention;

subsequently forming a resist pattern on the photoresist film;

forming a pattern on the silicone resin film by using the photoresist film on which the resist pattern is formed as a mask; and forming a pattern on the substrate by using the pattern-formed silicone resin film as a mask.

When the substrate has the organic film, the present invention provides a patterning process comprising: at least forming a photoresist film again over the silicone resin film by the rework process according to the present invention;

subsequently forming a resist pattern on the photoresist film;

forming a pattern on the silicone resin film by using the photoresist film on which the resist pattern is formed as a mask;

forming a pattern on the organic film by using the pattern-formed silicone resin film as a mask; and forming a pattern on the substrate by using the pattern-formed organic film as a mask.

When formation of a resist pattern fails such as generating a deviated resist pattern, according to the rework process of the present invention, the photoresist film is removed with a solvent while leaving the silicone resin film unremoved; a photoresist film is formed again over the silicone resin film; and then a pattern is formed on a substrate. This makes it possible to prevent transferring a pattern down to a substrate with a deviated resist pattern. Consequently, a substrate of high quality can be obtained. Moreover, production cost for the substrate can be reduced because time and manpower expended for producing the substrate are not wasted so much.

Furthermore, the present invention provides a substrate on which a pattern is formed by the patterning process according to the present invention.

When a pattern is formed on a substrate by the patterning process according to the present invention, a substrate on which a precise pattern is formed can be produced at a high yield.

Moreover, the present invention. provides a stripping solvent for dissolving and removing a photoresist film wherein at least the solvent removes the photoresist film over an antireflection silicone resin film while leaving the silicone resin film unremoved.

When the photoresist film is removed with such a solvent while leaving the silicone resin film unremoved and a photoresist film is formed again over the silicone resin film, the photoresist film can be reworked more easily at lower cost.

In this case, it is preferable that the solvent contains 50 mass % or more of a compound selected from the group consisting of a propylene glycol alkyl ether derivative and a saturated alkyl ketone having 5 or more carbon atoms; or 50 mass % or more in total of two or more compounds selected from the group consisting of a propylene glycol alkyl ether derivative and a saturated alkyl ketone having 5 or more carbon atoms.

In the above cases, the propylene glycol alkyl ether derivative may be any one or more compound(s) selected from the group consisting of propylene glycol methyl ether and propylene glycol methyl ether acetate. And the saturated alkyl ketone having 5 or more carbon atoms may be any one or more compound(s) selected from the group consisting of cyclopentanone, cyclohexanone, and 5-methyl-2-hexanone.

By using the solvent containing 50 mass % or more of a compound selected from the group consisting of a propylene glycol alkyl ether derivative and a saturated alkyl ketone having 5 or more carbon atoms; or 50 mass % or more in total of two or more compounds selected from the group consisting of a propylene glycol alkyl ether derivative and a saturated alkyl ketone having 5 or more carbon atoms, only the photoresist film can be removed more handily with hardly damaging the silicone resin film.

As described above, according to the present invention, the photoresist film is removed with a solvent while leaving the silicone resin film unremoved; and a photoresist film is formed again over the silicone resin film. In this way, the photoresist film can be reworked more easily at lower cost than before.

DESCRIPTION OF THE INVENTION AND A PREFERRED EMBODIMENT

A more thorough disclosure of the present invention is presented in the detailed description which follows.

As mentioned above, when deviation and so on is generated in a resist pattern, a photoresist film has conventionally been reworked as follows: All films including the photoresist film and films under the photoresist film such as an antireflection film are removed. Then again, an antireflection film and so on is formed, and a photoresist film is further formed thereon.

As with this method, to rework a photoresist film over a substrate having an antireflection silicone resin film and the photoresist film thereon, the following method has commonly been used: Both the silicone resin film and the photoresist film are removed, and then a silicone resin film and a photoresist film are formed again.

Then, the present inventors have investigated thoroughly to develop a rework process for a photoresist film that can be conducted more easily at lower cost than the conventional cumbersome and costly process.

As a result, the present inventors have found that when only the photoresist film is removed with a solvent while leaving the antireflection silicone resin film unremoved; and a photoresist film is formed again over the silicone resin film, the photoresist film can be reworked more easily at lower cost than before. Thus, they have accomplished the present invention.

Hereinafter, an embodiment of the present invention will be explained. However, the present invention is not limited thereto.

Figure 1:
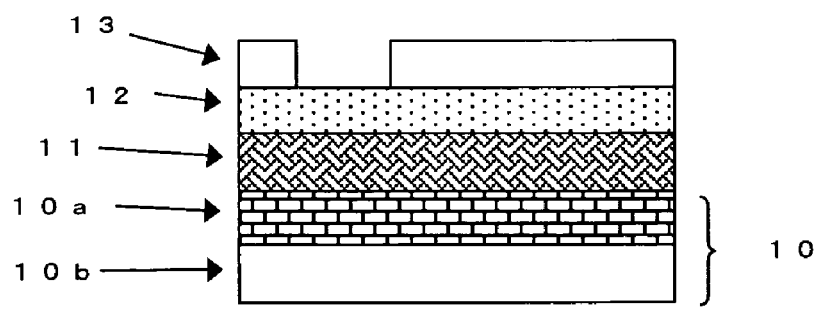
FIG. 1 is an explanatory view of one embodiment of a rework process for a photoresist film according to the present invention.
Figure 1:
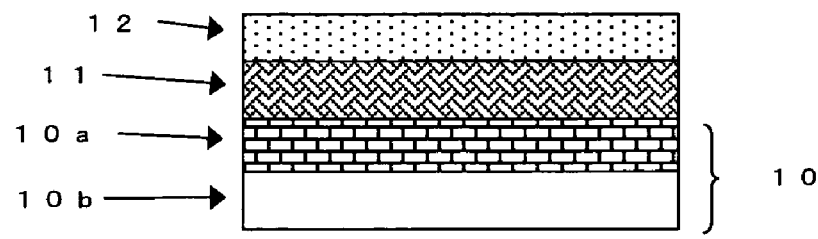
Figure 1:
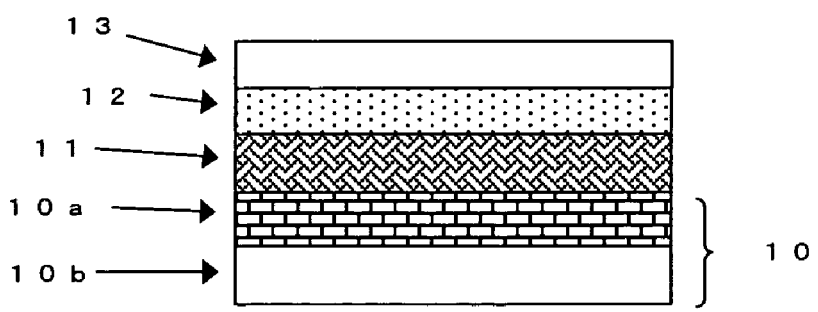

FIG. 1 is an explanatory view of one embodiment of a rework process for a photoresist film according to the present invention.

First, a substrate with a failed resist pattern and so on is used for reworking a photoresist film (see FIG. 1(a)). A substrate 10 in FIG. 1(a) has an organic film 11, an antireflection silicone resin film 12 thereon and a photoresist film 13 thereon, and has a failed resist pattern.

A failed resist pattern means, for example, a resist pattern whose size is out of spec, or a resist pattern in which pattern deviation is generated.

Size variation of a resist pattern and so on is inspected, for example, by providing in advance a dummy pattern the size of which is examined with a Scanning Electron Microscope (SEM), or by adding in advance a dummy wafer that is used for measuring the pattern size per a cassette. Then a substrate with a failed resist pattern such as a resist pattern whose size is out of spec, or a resist pattern in which a pattern deviation is generated is taken out, and the photoresist film over the substrate is reworked.

Second, the photoresist film 13 is removed with a solvent while leaving the silicone resin film 12 unremoved (see FIG. 1(b)).

A stripping solvent for dissolving and removing the photoresist film satisfies the requirement as long as the solvent at least can remove the photoresist film over the antireflection silicone resin film while leaving the silicone resin film unremoved.

Examples of such a solvent may include: ketones such as cyclopentanone, cyclohexanone, 5-methyl-2-hexanone, or ethyl-2-n-amyl ketone, or 4-hydroxy-4-methyl-2-pentanone; alcohols such as 3-methoxy butanol, 3-ethyl-3-methoxy butanol, 1-methoxy-2-propanol, 1-ethoxy-2-propanol; ethers such as propylene glycol monomethyl ether, ethylene glycol monomethyl ether, propylene glycol ethyl ether, ethylene glycol monoethyl ether, propylene glycol diethyl ether, diethylene glycol diethyl ether; esters such as propylene glycol monomethyl ether acetate, propylene glycol monoethyl ether acetate, ethyl lactate, ethyl pyruvate, butyl acetate, ethyl 3-methoxy propionate, ethyl 3-ethoxy propionate, tert-butyl acetate, tert-butyl propionate, propylene glycol mono tert-butyl-ether acetate; lactones such as γ-butyrolactone. Above solvents may be used alone or in admixture.

Among them, by using a solvent containing 50 mass % or more of a compound selected from the group consisting of a propylene glycol alkyl ether derivative and a saturated alkyl ketone having 5 or more carbon atoms; or 50 mass % or more in total of two or more compounds selected from the group consisting of a propylene glycol alkyl ether derivative and a saturated alkyl ketone having 5 or more carbon atoms, only the photoresist film can be removed more handily with hardly damaging the silicone resin film thereunder.

In this case, the propylene glycol alkyl ether derivative may optionally be any one or more compound(s) selected from the group consisting of propylene glycol methyl ether (1-methoxy-2-propanol) and propylene glycol methyl ether acetate. And the saturated alkyl ketone having 5 or more carbon atoms may optionally be any one or more compound(s) selected from the group consisting of cyclopentanone, cyclohexanone, and 5-methyl-2-hexanone.

Incidentally, in view of handleability, a solvent with a flash point of 40 degrees C. or more is preferably used. When a single solvent has a flash point of 40 degrees C. or less, a mixture of the solvent and other solvent(s) with a flash point of 40 degrees C. or more is preferably used due to ease of handling.

Next, a photoresist film 13 is formed again over the silicone resin film 12 (see FIG. 1(c)).

In this manner, when the photoresist film 13 is removed with a solvent while leaving the silicone resin film 12 unremoved and a photoresist film is formed again over the silicone resin film, it is not necessary to remove the silicone resin film. Consequently, the photoresist film can be reworked more easily at lower cost than before.

Hereinafter, the substrate 10, the organic film 11, the antireflection silicone resin film 12, and the photoresist film 13 will be explained.

The organic film 11 is formed over the substrate 10 by spin-coating or the like. Because the organic film functions as a mask when the substrate 10 is etched, it is desirable that the organic film has high etching resistance. Furthermore, because it is necessary for the organic film not to mix with the upper antireflection silicone resin film 12, it is desirable that the organic film crosslinks by heat or acid after the organic film is applied by spin-coating and so on.

The antireflection silicone resin film 12 can be formed over the organic film 11 by spin-coating or the like as with the formation of the organic film 11. After the composition is applied by spin-coating or the like, it is desirable to evaporate organic solvent and bake the resin to accelerate crosslinking reaction in order to prevent the resin from mixing with the photoresist film 13 which serves as the upper layer. A baking temperature is preferably in the range of 80 to 300 degrees C., and baking time is preferably in the range of 10 to 300 seconds.

Furthermore, after the antireflection silicone resin film 12 is formed, the photoresist film 13 is formed thereon. The photoresist film 13 is preferably formed by spin-coating as with the formation of the organic film 11 and the antireflection silicone resin film 12. After photoresist film composition is applied by spin-coating or the like, the composition is preferably prebaked. A prebaking temperature is preferably in the range of 80 to 180 degrees C., and prebaking time is preferably in the range of 10 to 300 seconds.

As for the antireflection silicone resin film, a film having cross-links between side chains of the silicone resin, between a side chain and a silanol group of the silicone resin, or both between side chains of the silicone resin and between a side chain and a silanol group of the silicone resin can be used.

In this case, it is preferable that the silicone resin film has the cross-links formed by any one or more of a crosslinkable hydroxy group and a crosslinkable epoxy group in a side chain of the silicone resin.

Such a silicone resin can be obtained, for example, by carrying out hydrolytic condensation of one kind or a mixture of two or more kinds of silicon-containing compounds represented by the following general formula (1).

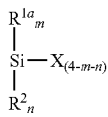 (1)

(In the formula, $R^{1a}$ is an organic group at least having a carbon-oxygen single bond or a carbon-oxygen double bond; $R^2$ is a monovalent organic group having a light absorbing group; X represents the same or different substituents selected from the group consisting of a halogen atom, a hydrogen atom, a hydroxy group, an alkoxy group having 1-6 carbon atoms, and an alkylcarbonyloxy group having 1-6 carbon atoms. Each of m and n represents o or a positive integer of 1 to 3 and satisfies the relationship of $0<(4-m-n)\leqq 4$.)

Mass-average molecular weight (relative to polystyrene standard) of a silicone resin obtained from silicon-containing compound(s) represented by the general formula (1) measured by gel permeation chromatography (GPC) is preferably 500 to 1,000,000, more preferably 1,000 to 500,000.

The organic group having at least one bond of a carbon-oxygen single bond and a carbon-oxygen double bond in the general formula (1) has preferably 2 to 30 carbon atoms, more preferably it is one or more organic group(s) selected from a group consisting of an epoxy group, an ester group, an alkoxy group, and a hydroxy group. The organic group means a group containing carbon, and may further contain hydrogen, nitrogen, sulfur, and so on. An example of the organic group having at least one of a carbon-oxygen single bond and a carbon-oxygen double bond in the general formula (1) is as follows.

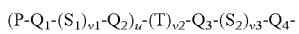

(In the formula, P represents a hydrogen atom, a hydroxy group, an epoxy ring ($OCH_2CH$—), a $C_{1-4}$ alkoxy group, a $C_{1-6}$ alkylcarbonyloxy group, or a $C_{1-6}$ alkylcarbonyl group. $Q_1$, $Q_2$, $Q_3$, and $Q_4$ independently represent —$C_qH_{2q-p}P_p$— (In the formula, P represents the same as above; p represents 0 or a positive integer of 1 to 3; q represents 0 or a positive integer of 1 to 10.) u represents 0 or a positive integer of 1 to 3. $S_1$ and $S_2$ independently represent —O—, —CO—, —OCO—, —COO—, or —OCOO—. $v_1$, $v_2$, and $v_3$ independently represent 0 or 1. Examples of T are shown below. Bonding sites of T to $Q_2$ and $Q_3$ are not particularly limited. The bonding sites may be properly selected in consideration of reactivity depending on stereostructure, availability of commercial reagents to be used for the reaction, and so on.)

T =

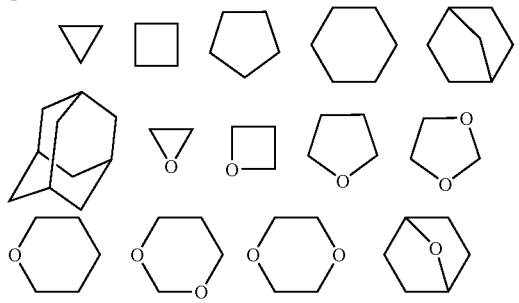

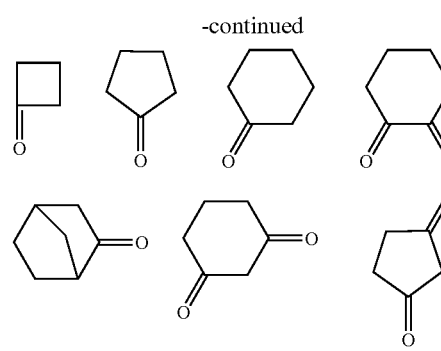

Suitable examples of the organic group at least having a carbon-oxygen single bond or a carbon-oxygen double bond in the general formula (1) are shown below. Incidentally, (Si) shows a bonding site with a Si atom in the following formulae.

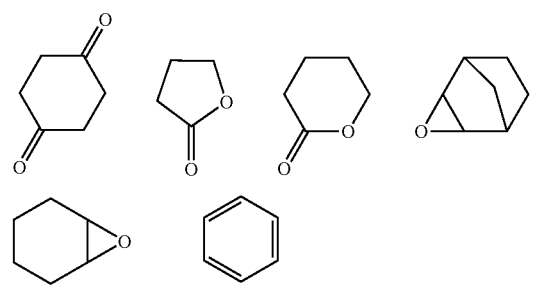

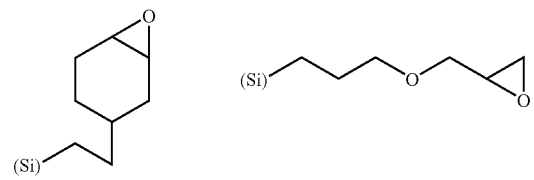

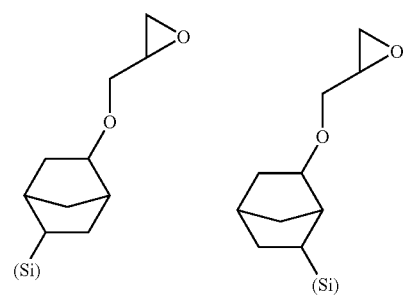

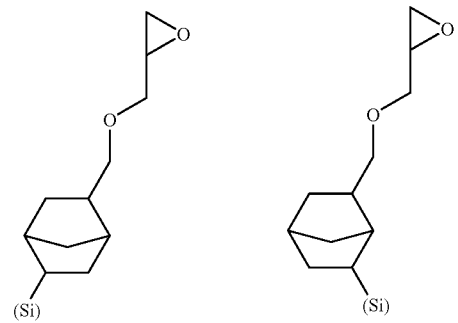

-continued
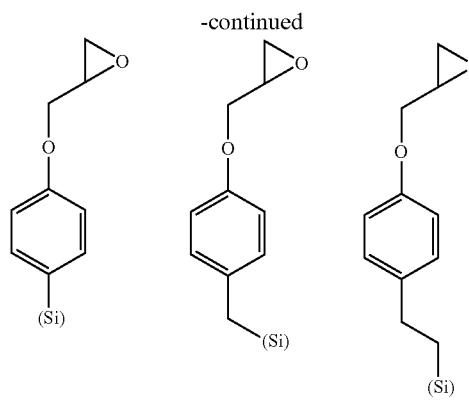
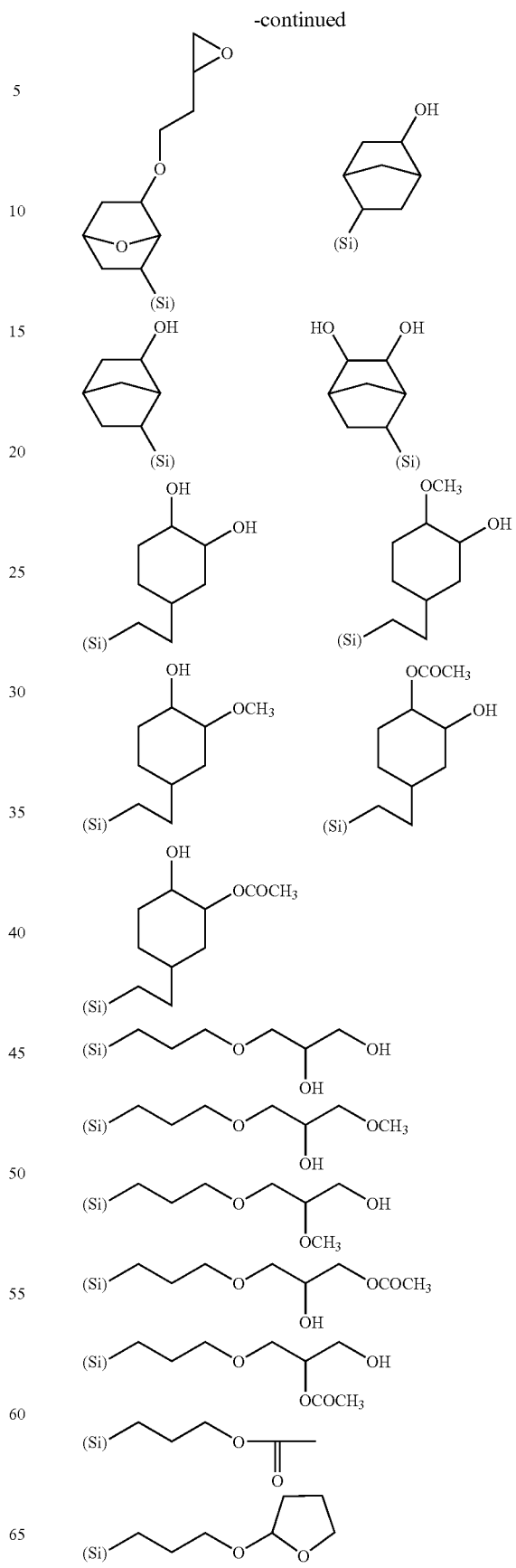

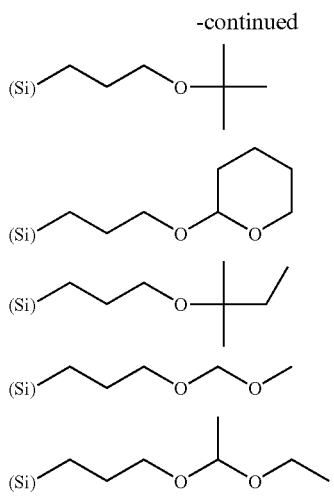

The light absorbing group in the general formula (1) absorbs light at a wavelength of 150 to 300 nm. This group preferably has any one or more of an anthracene ring, a naphthalene ring, and a benzene ring. Furthermore, these rings may have one or more of substituent (s). Suitable examples of the substituent may include $C_{1-6}$ alkyl group, $C_{1-6}$ alkoxy group, $C_{1-6}$ acyloxy group, and $C_{1-6}$ acetal group. More suitable examples of the substituent may include methyl group, methoxy group, t-butoxy group, t-amyloxy group, acetoxy group, 1-ethoxy ethoxy group, or the like. Examples of the light absorbing group are shown below.

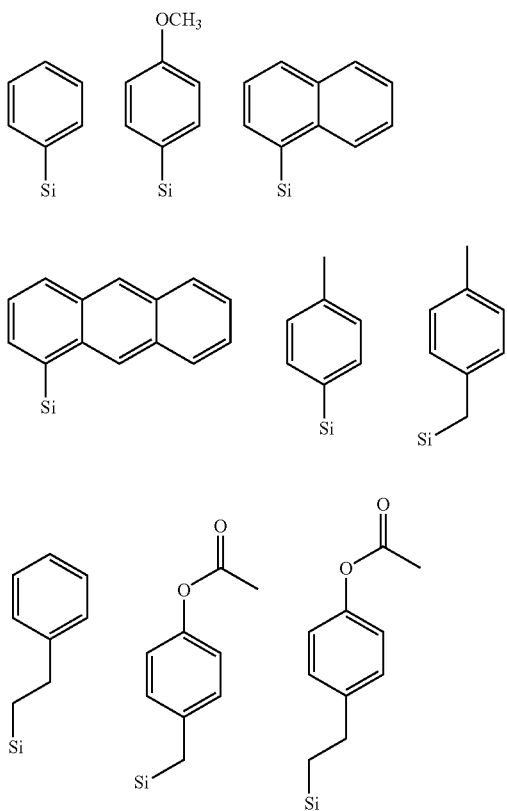

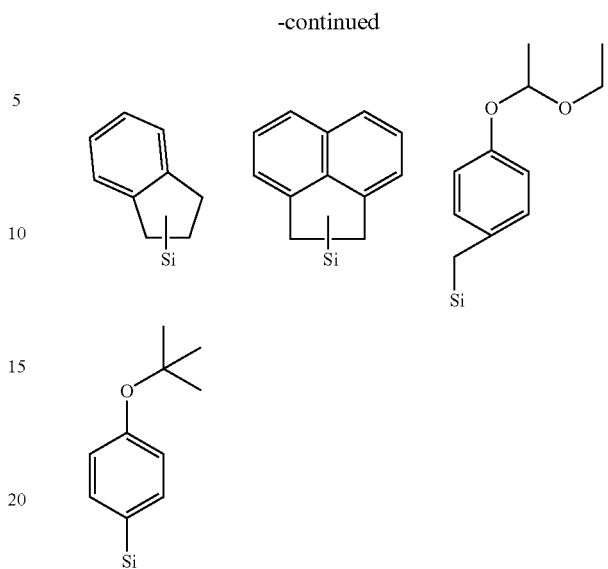

A methoxy group, an acetoxy group and an acetal group in the light absorbing group can also be deprotected to be a hydroxy group during or after polymerization.

In particular, the light absorbing group having a benzene ring or benzene rings is preferably used for lithography using light at a wavelength of 200 nm or less.

In addition to the aromatic light absorbing groups, a light absorbing group which has a Si—Si bond or Si—Si bonds can also be used. Specific examples thereof are shown below.

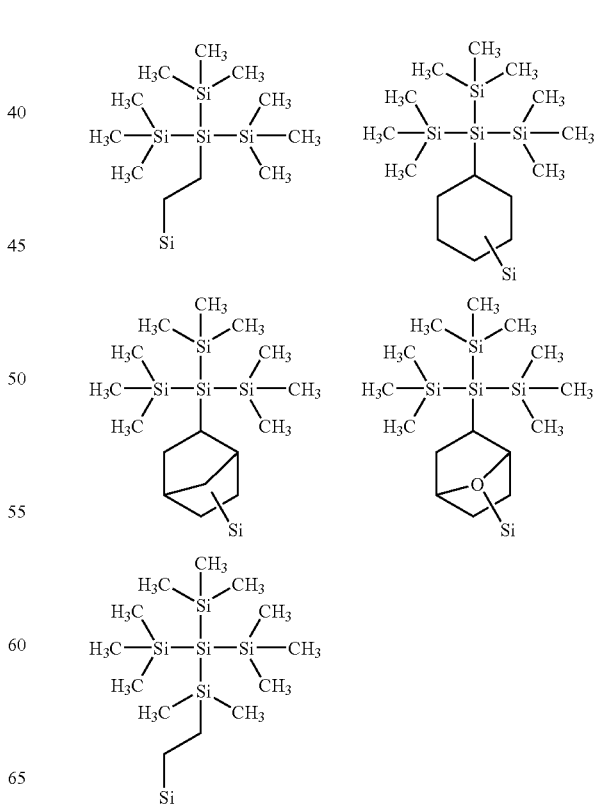

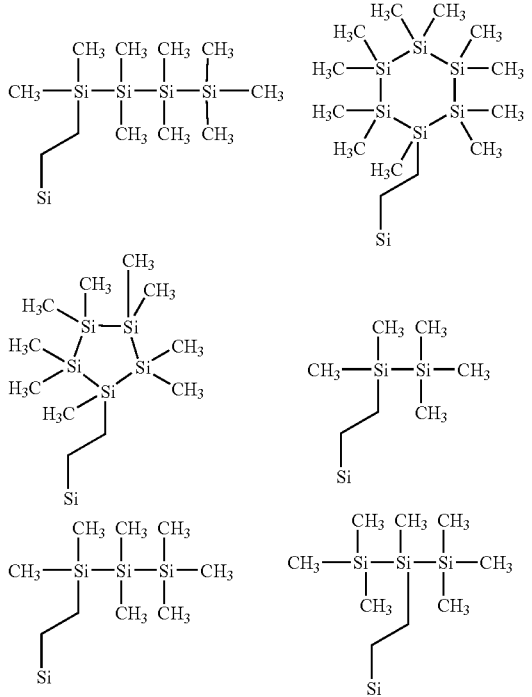

The silicone resin for the antireflection silicone resin film can be synthesized by carrying out hydrolytic co-condensation of the silicon-containing compounds (monomers) represented by the general formula (1).

Water is preferably added in an amount of 0.2-10 mole per one mole of the monomers in the hydrolytic reaction. A catalyst can also be used at this time. Examples of the catalyst may include acids such as acetic acid, propionic acid, oleic acid, stearic acid, linolic acid, salicylic acid, benzoic acid, formic acid, malonic acid, phthalic acid, fumaric acid, citric acid, tartaric acid, hydrochloric acid, sulfuric acid, nitric acid, sulfonic acid, methyl sulfonic acid, toluenesulfonic acid, trifluoromethane sulfonic acid; bases such as ammonia, sodium hydroxide, potassium hydroxide, barium hydroxide, calcium hydroxide, trimethylamine, triethylamine, triethanolamine, tetra methyl ammonium hydroxide, choline hydroxide, tetra butyl ammonium hydroxide; metal chelate compounds such as tetraalkoxy titanium, trialkoxy mono(acetyl acetonate) titanium, tetra alkoxy zirconium, trialkoxy mono (acetyl acetonate) zirconium.

The reaction may be conducted by dissolving water and a catalyst in an organic solvent, and then adding monomers thereto. At this moment, the monomers may be diluted with the organic solvent in advance. A reaction temperature is 0 to 100 degrees C., preferably 10 to 80 degrees C. The following method is preferably used: heating up to 10 to 50 degrees C. at the time of dropping monomers, and then heating to an elevated temperature of 40 to 80 degrees C. for aging.

Alternatively, the reaction may be conducted by dissolving a catalyst without moisture in an organic solvent, and then adding water or water diluted with an organic solvent thereto. A reaction temperature is 0 to 100 degrees C., preferably 10 to 80 degrees C. The following method is preferably used: heating up to 10 to 50 degrees C. at the time of dropping monomers, and then heating to an elevated temperature of 40 to 80 degrees C. for aging.

As for the organic solvent, those soluble in water are preferably used. Examples thereof may include: methanol, ethanol, 1-propanol, 2-propanol, 1-buthanol, 2-buthanol, 2-methyl-1-propanol, acetone, tetrahydrofuran, acetonitrile, propylene glycol monomethyl ether, ethylene glycol monomethyl ether, propylene glycol monomethyl ether, ethylene glycol monoethyl ether, propylene glycol dimethyl ether, diethylene glycol dimethyl ether, propylene glycol monomethyl ether acetate, propylene glycol monoethyl ether acetate, propylene glycol monopropyl ether, and a mixture thereof.

After that, an organic solvent which is hardly soluble or insoluble in water as shown below is added to the reaction mixture. Then, an organic-solvent layer is separated, and is washed with water to remove a catalyst used in the hydrolytic condensation. At this moment, the catalyst may be neutralized when necessary.

Suitable examples of the organic solvent which is hardly soluble or insoluble in water may include: tetrahydrofuran, toluene, hexane, ethyl acetate, cyclohexanone, methyl-2-n-amyl ketone, propyleneglycol monomethyl ether, ethylene glycol monomethyl ether, propylene glycol monomethyl ether, ethylene glycol monoethyl ether, propyleneglycol dimethyl ether, diethylene glycol dimethyl ether, propyleneglycol monomethyl ether acetate, propyleneglycol monoethyl ether acetate, ethyl pyruvate, butyl acetate, methyl 3-methoxy propionate, ethyl 3-ethoxy propionate, tert-butyl acetate, tert-butyl propionate, propyleneglycol mono tert-butyl-ether acetate, γ-butyl lactone, and a mixture thereof.

Then, an organic-solvent layer is separated and is dehydrated. Because remained moisture advances a condensation reaction of remained silanol, it is necessary to dehydrate the layer sufficiently. For example, an adsorption method with salts such as magnesium sulfate or molecular sieves, or an azeotropic dehydration method with removing the solvent is preferably used.

Alternatively, an organic solvent which is hardly soluble or insoluble in water may be used for hydrolytic condensation of the monomers. Examples thereof may include: tetrahydrofuran, toluene, hexane, ethyl acetate, cyclohexanone, methyl-2-n-amyl ketone, propyleneglycol monomethyl ether, ethylene glycol monomethyl ether, propylene glycol monomethyl ether, ethylene glycol monoethyl ether, propyleneglycol dimethyl ether, diethylene glycol dimethyl ether, propyleneglycol monomethyl ether acetate, propyleneglycol monoethyl ether acetate, ethyl pyruvate, butyl acetate, methyl 3-methoxy propionate, ethyl 3-ethoxy propionate, tert-butyl acetate, tert-butyl propionate, propyleneglycol mono tert-butyl-ether acetate, y-butyl lactone, and a mixture thereof.

Then, the monomers are dissolved in the organic solvent, and water is added thereto to initiate hydrolytic reaction.

The catalyst may be added to water or to the organic solvent in advance. A reaction temperature is 0 to 100 degrees C., preferably 10 to 80 degrees C. The following method is preferably used: heating up to 10 to 50 degrees C. at the time of dropping water, and then heating to an elevated temperature of 40 to 80 degrees C. for aging.

By adjusting the reaction conditions in the hydrolytic reaction, a silicone resin in which a ratio of a silicon atom with an end of Si—OH and/or Si—OR is 0.1 to 50 mole %. The end group can be identified easily with $^{29}$Si-NMR. When a ratio of a silicon atom with an end of Si—OH and/or Si—OR is defined as A mole %, A can be expressed by the following equation.

$$A(\%) = \frac{\sum_{n=1}^{3}(4-n)Qn + \sum_{n=1}^{2}(3-n)Tn + D1}{4 \times \sum_{n=1}^{4} Qn + 3 \times \sum_{n=1}^{3} Tn + 2 \times \sum_{n=1}^{2} Dn} \times 100$$

In the formula, $Q_1$, $Q_2$, $Q_3$, and $Q_4$ represent the number of siloxane bonding of a four functional Si atom; $T_1$, $T_2$, and $T_3$ represent the number of siloxane bonding of a trifunctional Si atom; and $D_1$ and $D_2$ represent the number of siloxane bonding of a bifunctional Si atom. Respective bonding amounts are calculated by using integrated peak values measured with $^{29}$Si-NMR.

At this moment, when A is 0.1 mole % or less, the number of end Si—OH and end Si—OR used for crosslinking resin may be so small that an applied film may not set hard enough. Consequently, the applied film can intermix with resist to be used in the subsequent step, and a resist pattern with a vertical wall profile may not be obtained. On the other hand, when A is 50 mole % or more, condensation may not occur enough and an applied film with insufficient strength can be obtained. This can provide undesired results like collapse of a resist pattern.

Furthermore, when A lies in the range of 0.1 mole % to 50 mole %, and the ratio of Si—OH to Si—OR lies in the following range, an applied film that set hard more sufficiently can be obtained. Specifically, it is more preferable that Si—OH/Si—OR is from (100/0) to (20/80). At this time, the ratio of —SiOH/—SiOR can be obtained with $^{13}$C-NMR by using an integral intensity (B) per a carbon atom at alpha position of an Si atom as an internal standard. That is, when R of —SiOR is $R_X$—CH$_2$, —SiOR is —SiOCH$_2$—$R_X$. And a Si—OR amount (B) is obtained from the ratio of integral intensity of the underlined carbon atom.

Use of $^{29}$Si-NMR provides a total amount (C) of Si—OH and Si—OR. Accordingly, the ratio of Si—OH to Si—OR satisfies the relationship: Si—OH/Si—OR =(C—B)/B.

When the ratio of Si—OR is less than Si—OH/Si—OR=20/80, condensation between Si—OHs and between Si—OH and Si—OR occur easily. Consequently, an applied film with sufficient strength that hardly intermix with other layers can be obtained.

Furthermore, when the organic group with carbon-oxygen bonds has an epoxy group, silicone resin is synthesized, and then modification reaction can convert the silicone resin to modified silicone resin having an organic group with mutually different carbon-oxygen bonds. Examples of an repeating unit of the modified silicone resin are shown below.

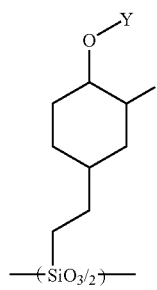
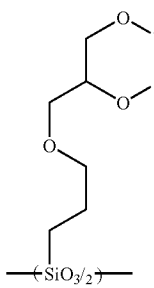

-continued

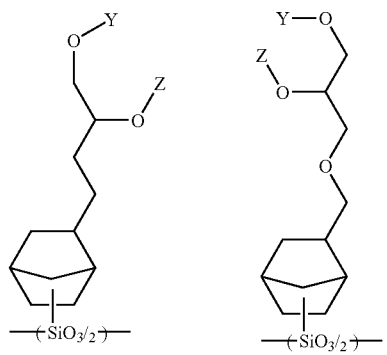

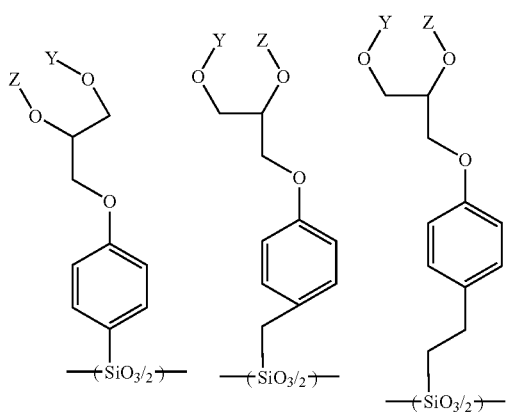

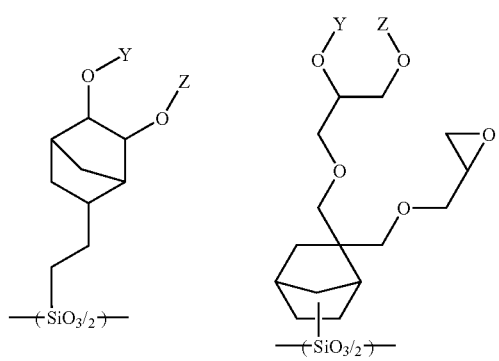

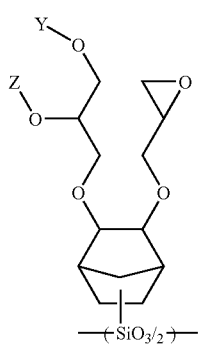
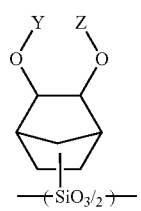

-continued

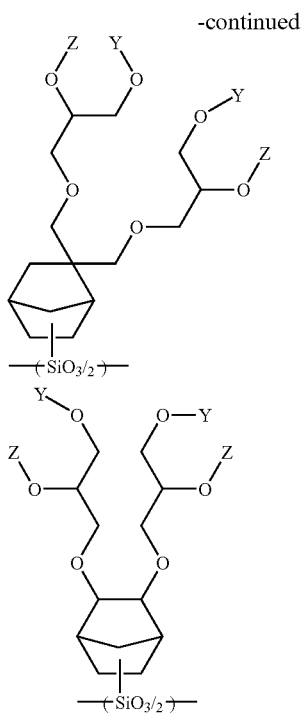

In the formulae, Y and Z independently represent a hydrogen atom, a $C_{1-6}$ alkyl group, a $C_{1-8}$ alkylcarbonyl group, or a $C_{1-6}$ alkoxycarbonyl group. Specifically, examples thereof may include: methyl group, ethyl group, n-propyl group, i-propyl group, n-butyl group, i-butyl group, sec-butyl group, t-butyl group, n-pentyl group, 2-ethylbutyl group, 3-ethylbutyl group, 2,2-diethylpropyl group, cyclopentyl group, n-hexyl group, cyclohexyl group, formyl group, acetyl group, propionyl group, butyryl group, isobutyryl group, valeryl group, iso valeryl group, pivaloyl group, cyclohexylcarbonyl group, methoxycarbonyl group, ethoxycarbonyl group, propoxycarbonyl group, butoxycarbonyl group, t-butoxycarbonyl group, and so on.

The conversion from an original silicone resin can be carried out with a commonly known techniques. For example, heating the original silicone resin together with alcohols or carboxylic acids in the presence of an acid catalyst, an alkaline catalyst, or quaternary ammonium catalyst converts the original silicone resin to a modified silicone resin easily. Incidentally, when a carboxylic acid is used in the reaction, the carboxylic acid itself works as a catalyst. Therefore, it is not necessary to add other catalyst in that case.

Examples of the acid catalyst used for the reaction may include: hydrochloric acid, nitric acid, sulfuric acid, phosphoric acid, perchloric acid, methansulfonic acid, benzenesulfonic acid, toluenesulfonic acid, trifluoro acetic acid, trifluoromethane sulfonic acid, oxalic acid, acetic acid, propionic acid, oleic acid, stearic acid, linoleic acid, salicylic acid, benzoic acid, formic acid, malonic acid, phthalic acid, fumaric acid, citric acid, tartaric acid, and so on.

Examples of the alkaline catalyst may include: bases such as ammonia, sodium hydroxide, potassium hydroxide, barium hydroxide, calcium hydroxide, triethylamine, triethanolamine, benzyl diethylamine, tetraethylammonium hydroxide, choline hydroxide, tetrabutylammonium hydroxide; quaternary ammonium catalysts such as benzyl triethylammonium chloride, benzyl triethylammonium bromide.

Blend of thus-obtained original silicone resin and modified silicone resin can also be used (hereinafter, "silicone resin" includes the original silicone resin, the modified silicone resin and blend of both). A blend ratio thereof has a significant effect on properties of an antireflection silicone resin film composition to be obtained. Accordingly, the silicone resin can be blended with an arbitrary ratio so that the best properties are obtained. It is more preferable to subject obtained blend to heating, stirring, ultrasonic irradiation, kneading, and so on to make the polymer composition uniform.

An organic solvent used for composition of the antireflection silicone resin film can be any organic solvent in which silicone resin, an acid generator, other additives and the like can be dissolved. Examples of such an organic solvent may include: ketones such as cyclohexanone and ethyl-2-n-amyl ketone; alcohols such as 3-methoxy butanol, 3-ethyl-3-methoxy butanol, 1-methoxy-2-propanol, 1-ethoxy-2-propanol; ethers such as propylene glycol monoethyl ether, ethylene glycol monoethyl ether, propylene glycol monoethyl ether, ethylene glycol monoethyl ether, propylene glycol diethyl ether, diethylene glycol diethyl ether; esters such as propylene glycol monoethyl ether acetate, propylene glycol monoethyl ether acetate, ethyl lactate, ethyl pyruvate, butyl acetate, ethyl 3-methoxy propionate, ethyl 3-ethoxy propionate, tert-butyl acetate, tert-butyl propionate, propylene-glycol mono tert-butyl-ether acetate; lactones such as γ-butyrolactone. Above solvents may be used alone or in admixture. The organic solvents are not restricted to those mentioned above.

Among the above organic solvents, diethylene glycol diethyl ether, 1-ethoxy-2-propanol, propylene glycol monoethyl ether acetate, or a mixture thereof is preferably used, because the solubility of an acid generator in the resist composition to these solvents is remarkably excellent.

Preferably, the organic solvent is used in an amount of 400 to 10,000 parts by mass, more preferably 500 to 5,000 parts by mass, to 100 parts by mass of the silicone resin.

To the antireflection silicone resin film, an acid generator can be added for further promoting a crosslinking reaction by heat. There are an acid generator which generates acid by pyrolysis and an acid generator which generates acid by optical irradiation, and either acid generator can be added.

Examples of the acid generator to be added are as follows:

i) an onium salt represented by the following general formulae (P1a-1), (P1a-2), (P1a-3) or (P1b), ii) a diazomethane derivative represented by the following general formula (P2), iii) a glyoxime derivative represented by the following general formula (P3), iv) a bis sulfone derivative represented by the following general formula (P4), v) a sulfonate of an N-hydroxy imide compound represented by the following general formula (P5), vi) a β-keto sulfonic-acid derivative, vii) a disulfone derivative, viii) a nitro benzyl sulfonate derivative, and ix) a sulfonate derivative, etc.

P1a-1

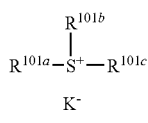

-continued

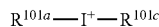  Pla-2

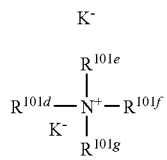  Pla-3

(In the formulae, $R^{101a}$, $R^{101b}$, and $R^{101c}$ independently represent a linear, branched or cyclic alkyl group, alkenyl group, oxoalkyl group or oxoalkenyl group each having 1-12 carbon atoms, an aryl group having 6-20 carbon atoms, an aralkyl group or an aryl oxoalkyl group having 7-12 carbon atoms. Some or all of hydrogen atoms of these groups may be substituted with an alkoxy group etc. $R^{101b}$ and $R^{101c}$ may constitute a ring. In the case that they constitute a ring, $R^{101b}$ and $R^{101c}$ represent an alkylene group having 1-6 carbon atoms respectively. $K^-$ represents a non-nucleophilic counter ion. $R^{101d}$, $R^{101e}$, $R^{101f}$ and $R^{101g}$ are represented by adding a hydrogen atom to $R^{101a}$, $R^{101b}$, and $R^{101c}$. $R^{101d}$ and $R^{101e}$, and $R^{101d}$, $R^{101e}$ and $R^{101f}$ may form a ring respectively. When they form a ring, $R^{101d}$ and $R^{101e}$, and $R^{101d}$, $R^{101e}$, and $R^{101f}$, represent an alkylene group having 3-10 carbon atoms.) The above-mentioned $R^{101a}$, $R^{101b}$, $R^{101c}$, $R^{101d}$, $R^{101e}$, $R^{101f}$, and $R^{101g}$ may be the same or different mutually. Examples thereof as an alkyl group may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cycloheptyl group, a cyclopropyl ethyl group, 4-ethyl cyclohexyl group, a cyclohexyl ethyl group, a norbornyl group, and an adamantyl group, etc. Examples of an alkenyl group may include: a vinyl group, an allyl group, a propenyl group, a butenyl group, a hexenyl group, and a cyclohexenyl group, etc. Examples of an oxo alkyl group may include: 2-oxocyclopentyl group, 2-oxocyclohexyl group, 2-oxopropyl group, 2-cyclopentyl-2-oxoethyl group, 2-cyclohexyl-2-oxoethyl group, 2-(4-ethylcyclohexyl)-2-oxoethyl group, etc. Examples of an oxoalkenyl group may include: 2-oxo-4-cyclohexenyl group, 2-oxo-4-propenyl group, etc. Examples of an aryl group may include: a phenyl group, a naphthyl group, etc.; and an alkoxy phenyl group such as p-methoxyphenyl group, m-methoxyphenyl group, o-methoxyphenyl group, an ethoxyphenyl group, p-tert-butoxyphenyl group and m-tert-butoxy phenyl group; an alkyl phenyl group such as 2-methylphenyl group, 3-methylphenyl group, 4-methylphenyl group, an ethylphenyl group, 4-tert-butylphenyl group, 4-butylphenyl group, a diethyl phenyl group, etc.; an alkyl naphthyl group such as a methylnaphthyl group, an ethyl naphthyl group, etc.; an alkoxy naphthyl group such as a methoxy naphthyl group, an ethoxy naphthyl group, etc.; a dialkyl naphthyl group such as a dimethyl naphthyl group, a diethyl naphthyl group, etc.; a dialkoxy naphthyl group such as a dimethoxy naphthyl group, a diethoxy naphthyl group, etc. Examples of the aralkyl group may include a benzyl group, a phenylethyl group, a phenethyl group, etc. Examples of an aryl oxoalkyl group may include: 2-aryl-2-oxoethyl group such as 2-phenyl-2-oxoethyl group, 2-(1-naphthyl)-2-oxoethyl group, 2-(2-naphthyl)-2-oxoethyl group, etc.

Examples of a non-nucleophilic counter ion as $K^-$ may include: a halide ion such as a chloride ion, a bromide ion, etc.; a fluoro alkyl sulfonate such as triflate, 1,1,1-trifluoro ethanesulfonate, nonafluoro butane sulfonate, etc.; an aryl sulfonate such as tosylate, benzene sulfonate, 4-fluorobenzene sulfonate, 1,2,3,4,5-pentafluoro benzene sulfonate, etc.; and an alkyl sulfonate such as mesylate, butane sulfonate, etc.

While (P1a-1) and (P1a-2) have both effects of a photo acid generator and a thermal acid generator, (P1a-3) acts as a thermal acid generator.

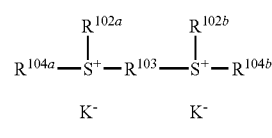  P1b (In the formula, $R^{102a}$ and $R^{102b}$ each represents a linear, branched or cyclic alkyl group having 1-8 carbon atoms. $R^{103}$ represents a linear, branched or cyclic alkylene group having 1-10 carbon atoms. $R^{104a}$ and $R^{104b}$ each represents a 2-oxoalkyl group having 3-7 carbon atoms. $K^-$ represents a non-nucleophilic counter ion.)

Examples of the $R^{102a}$ and $R^{102b}$ may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cyclopropylethyl group, 4-ethylcyclohexyl group, a cyclohexyl ethyl group, etc.

Examples of $R^{103}$ may include: a methylene group, an ethylene group, a propylene group, a butylene group, a pentylene group, a hexylene group, a heptylene group, an octylene group, a nonylene group, 1,4-cyclohexylene group, 1,2-cyclohexylene group, 1,3-cyclopentylene group, 1,4-cyclooctylene group, 1,4-cyclohexane dimethylene group, etc.

Examples of $R^{104a}$ and $R^{104b}$ may include: 2-oxopropyl group, 2-oxocyclopentyl group, 2-oxocyclohexyl group, 2-oxocycloheptyl group, etc.

Examples of $K^-$ may include the same as mentioned in the formulae (P1a-1), (P1a-2) and (P1a-3).

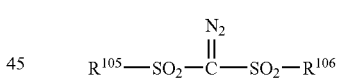  P2

(In the formula, $R^{105}$ and $R^{106}$ independently represent a linear, branched or cyclic alkyl group or a halogenated alkyl group having 1-12 carbon atoms, an aryl group or a halogenated aryl group having 6-20 carbon atoms, or an aralkyl group having 7-12 carbon atoms.)

Examples of an alkyl group as $R^{105}$ and $R^{106}$ may include: a methyl group, an ethyl group, a propyl group, an isopropyl group, n-butyl group, sec-butyl group, tert-butyl group, a pentyl group, a hexyl group, a heptyl group, an octyl group, an amyl group, a cyclopentyl group, a cyclohexyl group, a cycloheptyl group, a norbornyl group, an adamantyl group, etc.

Examples of a halogenated alkyl group as $R^{105}$ and $R^{106}$ may include: trifluoroethyl group, 1,1,1-trifluoroethyl group, 1,1,1-trichloroethyl group, a nonafluoro butyl group, etc. Examples of an aryl group may include: a phenyl group, an alkoxyphenyl group such as p-methoxyphenyl group, m-methoxyphenyl group, o-methoxyphenyl group, an ethoxyphenyl group, p-tert-butoxyphenyl group, m-tert-butoxyphenyl group, etc.; and an alkylphenyl group such as 2-ethylphenyl group, 3-ethylphenyl group,-4-ethylphenyl group, a methylphenyl group, 4-tert-butylphenyl group, 4-butylphenyl group, a diethylphenyl group, etc.

Examples of a halogenated aryl group as $R^{105}$ and $R^{106}$ may include: a fluorophenyl group, a chlorophenyl group, 1,2,3,4,5-pentafluoro phenyl group, etc.

Examples of an aralkyl group as $R^{105}$ and $R^{106}$ may include: a benzyl group, a phenethyl group, etc.

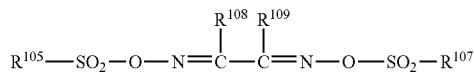

P3

(In the formula, $R^{107}$, $R^{108}$ and $R^{109}$ independently represent a linear, branched, cyclic alkyl group or halogenated alkyl group having 1-12 carbon atoms, an aryl group or a halogenated aryl group having 6-20 carbon atoms, or an aralkyl group having 7-12 carbon atoms. $R^{108}$ and $R^{109}$ may be bonded each other and form a cyclic structure. When they form a cyclic structure, $R^{108}$ and $R^{109}$ each independently represents a linear or branched alkylene group having 1-6 carbon atoms. $R^{105}$ represents the same group as that in the formula P2.)

Examples of the alkyl group, the halogenated alkyl group, the aryl group, the halogenated aryl group, and the aralkyl group as $R^{107}$, $R^{108}$ and $R^{109}$ may be the same as those explained for $R^{105}$ and $R^{106}$. Examples of an alkylene group for $R^{108}$ and $R^{109}$ may include: a methylene group, an ethylene group, a propylene group, a butylene group, a hexylene group, etc.

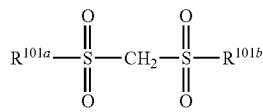

P4

(In the formula, $R^{101a}$ and $R^{101b}$ are the same as explained above.)

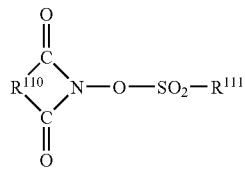

P5

(In the formula, $R^{110}$ represents an arylene group having 6-10 carbon atoms, an alkylene group having 1-6 carbon atoms or an alkenylene group having 2-6 carbon atoms. Some or all of hydrogen atoms of these groups may be further substituted with a linear or branched alkyl group or an alkoxy group having 1-4 carbon atoms, a nitro group, an acetyl group, or a phenyl group. $R^{111}$ represents a linear, branched or substituted alkyl group, alkenyl group or alkoxy alkyl group having 1-8 carbon atoms, a phenyl group or a naphthyl group. Some or all of hydrogen atoms of these groups may be substituted with an alkyl group or an alkoxy group having 1-4 carbon atoms; a phenyl group which may be substituted with an alkyl group or an alkoxy group having 1-4 carbon atoms, a nitro group or an acetyl group; a hetero aromatic group having 3-5 carbon atoms; or a chlorine atom or a fluorine atom.)

Examples of the arylene group as $R^{110}$ may include: 1,2-phenylene group, 1,8-naphtylene group, etc. Examples of the alkylene group may include: a methylene group, an ethylene group, a trimethylene group, a tetramethylene group, a phenylethylene group, a norbornane-2,3-di-yl group, etc. Examples of the alkenylene group may include: 1,2-vinylene group, 1-phenyl-1,2-vinylene group, 5-norbornene-2,3-di-yl group, etc.

Examples of the alkyl group as $R^{111}$ may be the same as those for $R^{101a}$-$R^{101c}$. Examples of the alkenyl group as $R^{111}$ may include: a vinyl group, a 1-propenyl group, an allyl group, a 1-butenyl group, a 3-butenyl group, an isoprenyl group, a 1-pentenyl group, a 3-pentenyl group, a 4-pentenyl group, a diethyl allyl group, a 1-hexenyl group, a 3-hexenyl group, a 5-hexenyl group, a 1-heptenyl group, a 3-heptenyl group, a 6-heptenyl group, a 7-octenyl group, etc. Examples of the alkoxy alkyl group may include: a methoxy ethyl group, an ethoxy ethyl group, a propoxy ethyl group, a butoxy ethyl group, a pentyloxy ethyl group, a hexyloxy ethyl group, a heptyloxy ethyl group, a methoxy propyl group, an ethoxy propyl group, a propoxy propyl group, a butoxy propyl group, a methoxy butyl group, an ethoxy butyl group, a propoxy butyl group, a methoxy pentyl group, an ethoxy pentyl group, a methoxy hexyl group, a methoxy heptyl group, etc.

Examples of the alkyl group having 1-4 carbon atoms which may be further substituted may include: a methyl group, an ethyl group, a propyl group, an isopropyl group, an n-butyl group, an isobutyl group, a tert-butyl group, etc. Examples of the alkoxy group having 1-4 carbon atoms may include: a methoxy group, an ethoxy group, a propoxy group, an isopropoxy group, an n-butoxy group, an isobutoxy group, a tert-butoxy group, etc.

Examples of the phenyl group which may be substituted with an alkyl group and an alkoxy group having 1-4 carbon atoms, a nitro group or an acetyl group may include: a phenyl group, a tolyl group, a p-tert-butoxy phenyl group, a p-acetyl phenyl group, a p-nitrophenyl group, etc. Examples of a hetero aromatic group having 3-5 carbon atoms may include: a pyridyl group, a furyl group, etc.

Examples of an acid generator may include: an onium salt such as tetraethyl ammonium trifluoromethane sulfonate, tetraethyl ammonium nonafluoro butane sulfonate, tetra n-butyl-ammonium nonafluoro butane sulfonate, tetraphenyl ammonium nonafluoro butane sulfonate, tetraethyl ammonium p-toluene sulfonate, diphenyl iodinium trifluoromethane sulfonate, (p-tert-butoxy phenyl) phenyl iodinium trifluoromethane sulfonate, diphenyl iodinium p-toluene sulfonate, (p-tert-butoxy phenyl) phenyl iodinium p-toluene sulfonate, triphenyl sulfonium trifluoromethane sulfonate, (p-tert-butoxy phenyl) diphenyl sulfonium trifluoromethane sulfonate, bis(p-tert-butoxy phenyl) phenyl sulfonium trifluoromethane sulfonate, tris (p-tert-butoxy phenyl) sulfonium trifluoromethane sulfonate, triphenyl sulfonium p-toluene sulfonate, (p-tert-butoxy phenyl) diphenyl sulfonium p-toluene sulfonate, bis(p-tert-butoxy phenyl) phenyl sulfonium p-toluene sulfonate, tris (p-tert-butoxy phenyl) sulfonium p-toluene sulfonate, triphenyl sulfonium nonafluoro butane sulfonate, triphenyl sulfonium butane sulfonate, triethyl sulfonium trifluoromethane sulfonate, triethyl sulfonium p-toluene sulfonate, cyclohexyl ethyl (2-oxocyclohexyl) sulfonium trifluoromethane sulfonate, cyclohexyl ethyl (2-oxo cyclohexyl) sulfonium p-toluene sulfonate, diethyl phenyl sulfonium trifluoromethane sulfonate, diethyl phenyl sulfonium p-toluene sulfonate, dicyclohexyl phenyl sulfonium trifluoromethane sulfonate, dicyclohexyl phenyl sulfonium p-toluene sulfonate, trinaphthylsulfonium trifluoromethane sulfonate, (2-norbornyl) ethyl (2-oxocyclohexyl)

sulfonium trifluoromethane sulfonate, ethylene bis [ethyl (2-oxocyclopentyl) sulfonium trifluoromethane sulfonate], 1,2'-naphthyl carbonyl ethyl-tetrahydro thiophenium triflate, etc.

Examples of a diazomethane derivative may include: bis (benzene sulfonyl) diazomethane, bis(p-toluene sulfonyl) diazomethane, bis(xylene sulfonyl) diazomethane, bis(cyclohexyl sulfonyl) diazomethane, bis(cyclopentyl sulfonyl) diazomethane, bis(n-butylsulfonyl) diazomethane, bis(isobutyl sulfonyl) diazomethane, bis(sec-butylsulfonyl) diazomethane, bis(n-propylsulfonyl) diazomethane, bis(isopropyl sulfonyl) diazomethane, bis(tert-butyl-sulfonyl) diazomethane, bis(n-amylsulfonyl) diazomethane, bis (isoamylsulfonyl) diazomethane, bis(sec-amylsulfonyl) diazomethane, bis(tert-amylsulfonyl) diazomethane, 1-cyclohexylsulfonyl-1-(tert-butyl-sulfonyl) diazomethane, 1-cyclohexyl sulfonyl-1-(tert-amyl sulfonyl) diazomethane, 1-tert-amyl sulfonyl-1-(tert-butyl-sulfonyl) diazomethane, etc.

Examples of a glyoxime derivative may include: bis-O-(p-toluene sulfonyl)-α-diethylglyoxime, bis-O-(p-toluene sulfonyl)-α-diphenyl glyoxime, bis-O-(p-toluene sulfonyl)-α-dicyclohexyl glyoxime, bis-O-(p-toluene sulfonyl)-2,3-pentanedione glyoxime, bis-O-(p-toluene sulfonyl)-2-ethyl-3,4-pentanedione glyoxime, bis-O-(n-butane sulfonyl)-α-diethylglyoxime, bis-O-(n-butane sulfonyl)-α-diphenyl glyoxime, bis-O-(n-butane sulfonyl)-α-dicyclohexyl glyoxime, bis-O-(n-butane sulfonyl)-2,3-pentanedione glyoxime, bis-O-(n-butane sulfonyl)-2-ethyl-3,4-pentanedione glyoxime, bis-O-(methane sulfonyl)-α-diethylglyoxime, bis-O-(trifluoromethane sulfonyl)-α-diethylglyoxime, bis-O-(1,1,1-trifluoro ethane sulfonyl)-α-diethylglyoxime, bis-O-(tert-butane sulfonyl)-α-diethylglyoxime, bis-O-(perfluoro octane sulfonyl)-α-diethylglyoxime, bis-O-(cyclohexane sulfonyl)-α-diethylglyoxime, bis-O-(benzene sulfonyl)-α-diethylglyoxime, bis-O-(p-fluorobenzene sulfonyl)-α-diethylglyoxime, bis-O-(p-tert-butylbenzene sulfonyl)-α-diethylglyoxime, bis-O-(xylene sulfonyl)-α-diethylglyoxime, bis-O-(camphor sulfonyl)-α-diethylglyoxime, etc.

Examples of a bissulfone derivative may include: bis naphthyl sulfonyl methane, bis-trifluoro ethyl sulfonyl methane, bis ethyl sulfonyl methane, bis propyl sulfonyl methane, bis isopropyl sulfonyl methane, bis-p-toluene sulfonyl methane, bis benzene sulfonyl methane, etc.

Examples of the β-ketosulfone derivative may include: 2-cyclohexyl carbonyl-2-(p-toluene sulfonyl) propane, 2-isopropyl carbonyl-2-(p-toluene sulfonyl) propane, etc.

Examples of the disulfone derivative may include: a diphenyl disulfone derivative, a diyclohexyl disulfone derivative, etc.

Examples of the nitro benzyl sulfonate derivative may include: 2,6-dinitro benzyl p-toluenesulfonate, 2,4-dinitro benzyl p-toluenesulfonate, etc.

Examples of the sulfonate derivative may include: 1,2,3-tris(methane sulfonyloxy) benzene, 1,2,3-tris(trifluoromethane sulfonyloxy) benzene, 1,2,3-tris(p-toluene sulfonyloxy) benzene, etc.

Examples of the sulfonate derivative of N-hydroxy imide compound may include: N-hydroxy succinimide methane sulfonate, N-hydroxy succinimide trifluoromethane sulfonate, N-hydroxy succinimide ethane sulfonate, N-hydroxy succinimide 1-propane sulfonate, N-hydroxy succinimide 2-propane sulfonate, N-hydroxy succinimide 1-pentane sulfonate, N-hydroxy succinimide 1-octane sulfonate, N-hydroxy succinimide p-toluenesulfonate, N-hydroxy succinimide p-methoxybenzene sulfonate, N-hydroxy succinimide 2-chloroethane sulfonate, N-hydroxy succinimide benzene sulfonate, N-hydroxy succinimide-2,4,6-triethyl benzene sulfonate, N-hydroxy succinimide 1-naphthalene sulfonate, N-hydroxy succinimide 2-naphthalene sulfonate, N-hydroxy-2-phenyl succinimide methane sulfonate, N-hydroxy maleimide methane sulfonate, N-hydroxy maleimide ethane sulfonate, N-hydroxy-2-phenyl maleimide methane sulfonate, N-hydroxy glutarimide methane sulfonate, N-hydroxy glutarimide benzenesulfonate, N-hydroxy phthalimide methane sulfonate, N-hydroxy phthalimide benzenesulfonate, N-hydroxy phthalimide trifluoromethane sulfonate, N-hydroxy phthalimide p-toluenesulfonate, N-hydroxy naphthalimide methane sulfonate, N-hydroxy naphthalimide benzenesulfonate, N-hydroxy-5-norbornene-2,3-dicarboxyimide methane sulfonate, N-hydroxy-5-norbornene-2, 3-dicarboxyimide trifluoromethane sulfonate, N-hydroxy-5-norbornene-2,3-dicarboxyimide p-toluenesulfonate, etc.

Suitable examples thereof may include: an onium salt such as triphenyl sulfonium trifluoromethane sulfonate, (p-tert-butoxy phenyl) diphenyl sulfonium trifluoromethane sulfonate, tris (p-tert-butoxy phenyl) sulfonium trifluoromethane sulfonate, triphenyl sulfonium p-toluene sulfonate, (p-tert-butoxy phenyl) diphenyl sulfonium p-toluene sulfonate, tris (p-tert-butoxy phenyl) sulfonium p-toluene sulfonate, trinaphthylsulfonium trifluoromethane sulfonate, cyclohexyl ethyl (2-oxocyclohexyl) sulfonium trifluoromethane sulfonate, (2-norbonyl)ethyl (2-oxocyclohexyl) sulfonium trifluoromethane sulfonate, 1,2'-naphthyl carbonylethyl tetrahydrothiophenium triflate, etc.;

a diazomethane derivative such as bis(benzene sulfonyl) diazomethane, bis(p-toluene sulfonyl) diazomethane, bis(cyclohexyl sulfonyl) diazomethane, bis(n-butylsulfonyl) diazomethane, bis(isobutyl sulfonyl) diazomethane, bis(sec-butylsulfonyl) diazomethane, bis(n-propyl sulfonyl) diazomethane, bis(isopropyl sulfonyl) diazomethane, bis (tert-butylsulfonyl) diazomethane, etc.;

a glyoxime derivative, such as bis-O-(p-toluene sulfonyl)-α-diethylglyoxime, bis-O-(n-butane sulfonyl)-α-diethylglyoxime, etc.;

a bissulfone derivative, such as bisnaphthyl sulfonyl methane;

a sulfonate derivative of N-hydroxyimide compounds, such as N-hydroxy succinimide methane sulfonate, N-hydroxy succinimide trifluoromethane sulfonate, N-hydroxy succinimide 1-propane sulfonate, N-hydroxy succinimide 2-propane sulfonate, N-hydroxy succinimide 1-pentane sulfonate, N-hydroxy succinimide p-toluene sulfonate, N-hydroxy naphthalimide methane sulfonate, N-hydroxy naphthalimide benzene sulfonate, etc.

Incidentally, the acid generator may be used alone or in admixture.

An amount of the acid generator to be added is preferably 0.1 to 50 parts by mass, more preferably 0.3 to 40 parts by mass per 100 parts by mass of the silicone resin. When 0.1 parts by mass or more of the acid generator is added, sufficient amount of acid is generated and a crosslinking reaction is induced sufficiently. On the other hand, when 50 parts by mass or less of the acid generator is added, there is less possibility that mixing phenomenon in which acid migrates to the upper photoresist layer occurs.

By the way, neutralizer may be added to the antireflection silicone resin film.

The neutralizer is a composition that prevents generated acid from diffusing to a photoresist film to be applied in the subsequent step. Examples of the neutralizer may include: an epoxy compound, a melamine compound, a guanamine compound, a glycol uryl compound and an urea compound, substituted by at least one group selected from a group consisting of a methylol group, an alkoxy ethyl group, and acyloxy ethyl group, and so on.

Examples of the epoxy compound among the neutralizer include: tris (2,3-epoxy propyl) isocyanurate, tri methylol methane tri glycidyl ether, trimethylol propane tri glycidyl ether, tri ethylol ethane triglycidyl ether, and the like.

Illustrative examples of the melamine compound among the neutralizer include: hexamethylol melamine, hexamethoxy ethyl melamine, a compound in which 1-6 of methylol groups of hexamethylol melamine is methoxy ethylated and a mixture thereof, hexamethoxy ethyl melamine, hexaacyloxy ethyl melamine, and a compound in which 1-5 of methylol groups of hexamethylol melamine is acyloxy ethylated and a mixture thereof.

Examples of a guanamine compound among the neutralizer include: tetramethylol guanamine, tetra methoxy ethyl guanamine, a compound in which 1-4 of methylol groups of a tetramethylol guanamine is methoxy ethylated and a mixture thereof, tetra methoxy ethyl guanamine, tetra acyloxy guanamine, and a compound in which 1-4 of methylol groups of tetramethylol guanamine is acyloxy ethylated and a mixture thereof.

Examples of a glycol uryl compound among the neutralizer include: tetramethylol glycol uryl, tetra methoxy glycol uryl, tetra methoxy ethyl glycol uryl, a compound in which 1-4 of the methylol groups of tetramethylol glycol uryl is metoxy ethylated and a mixture thereof, and a compound in which 1-4 of the methylol groups of tetrametylol glycol uryl is acyloxy ethylated and a mixture thereof.

Examples of an urea compound among the neutralizer include: tetramethylol urea, tetramethoxy methyl urea, tetramethoxy ethyl urea, and a compound in which 1-4 of methylol groups of tetramethylol urea are methoxy ethylated and a mixture thereof.

An amount of the neutralizer to be added is preferably 0 to 50 parts (hereinafter, parts means parts by mass), more preferably 0 to 40 parts per 100 parts of the silicone resin.

By the way, generally known photoresist film compositions can be used for forming the photoresist film. For example, base resin, organic solvent, and acid generator may be combined and used as the composition. Examples of the base resin may include one or more polymer(s) selected from the group: polyhydroxystyrene and its derivatives; polyacrylic acid and its derivatives; polymethacrylic acid and its derivatives; copolymer synthesized with selecting monomers from hydroxystyrene, acrylic acid, methacrylic acid and derivatives thereof; copolymer synthesized with selecting three or more monomers from cycloolefin and its derivatives, maleic anhydride, and acrylic acid and its derivatives; copolymer synthesized with selecting three or more monomers from cycloolefin and its derivatives, maleimide, and acrylic acid and its derivatives; polynorbornene; and ring-opening metathesis polymer. Incidentally, the derivatives as mentioned above each has its original main skeleton after being derived. For example, acrylic acid derivatives include acrylate and so on, methacrylic acid derivatives include methacrylate and so on, and hydroxystyrene derivatives include alkoxystyrene and so on.

In particular, photoresist film compositions for KrF excimer laser may include: polyhydroxystyrene(PHS), copolymer synthesized with selecting monomers from hydroxystyrene, styrene, acrylate, methacrylate and maleimide N carboxylate. Photoresist film compositions for ArF excimer laser may include: polyacrylates, polymethacrylates, alternating copolymers of norbornene and maleic anhydride, alternating copolymers of tetracyclododecene and maleic anhydride, polynorbornenes, and ring-opening metathesis polymers. However, photoresist film compositions are not restricted thereto.

In positive photoresist film compositions, a dissolution rate at non-exposed areas are generally decreased by substituting a hydroxy group of phenol or a carboxyl group with an acid labile group. That is, a base resin in which a hydrogen atom of a carboxyl group or a hydrogen atom of a phenolic hydroxy group is substituted with an acid labile group with the capability of controlling alkali solubility; and an acid generated upon exposure cleaves the acid labile group to enhance solubility to aqueous alkaline solutions is combined with other components to provide positive photoresist film composition.

As for an organic solvent and an acid generator for photoresist film compositions, the above-mentioned organic solvents and acid generators for silicone resin film compositions can be used. As for an addition amount of each component in photoresist film composition, for example, an addition amount of the base resin is as with an addition amount of silicone resin in silicone resin film composition; and an addition amount of the organic solvent and the acid generator for photoresist film compositions is as with an addition amount of the organic solvent and the acid generator for silicone resin film compositions.

Examples of resin for an organic film may include: cresolnovolac, naphthol-novolac, naphtholdicyclopentadien-novolac, amorphous carbon, polyhydroxystyrene, acrylate, methacrylate, polyimide, polysulfone and so on.

The substrate 10 to be used for patterning is not particularly limited and silicon wafers and so on can be used. Incidentally, in an embodiment in FIG. 1, the substrate 10 consists of a base layer 10b and a process layer 10a thereon.

A thickness of each film are, for example, 50 to 2000 nm for the organic film 11, 10 to 2000 nm for the antireflection silicone resin film 12, and 0.1 to 1 μm (preferably, 100 to 500 nm) for the photoresist film 13. However, each thickness is not limited thereto.

Hereinafter, a patterning process according to the present invention will be explained.

Figure 2:
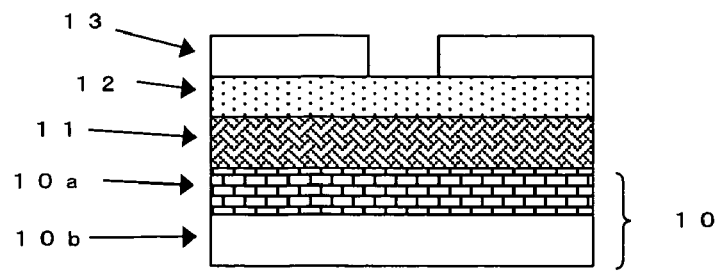
FIG. 2 is an explanatory view of one embodiment of a patterning process according to the present invention.
Figure 2:
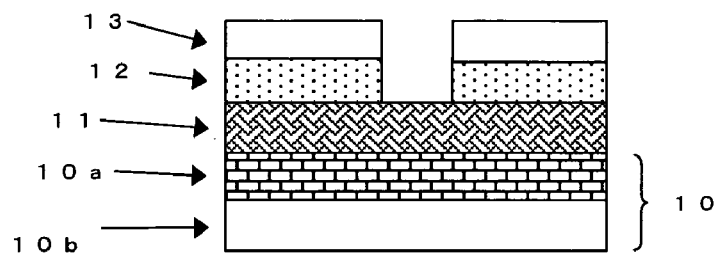
Figure 2:
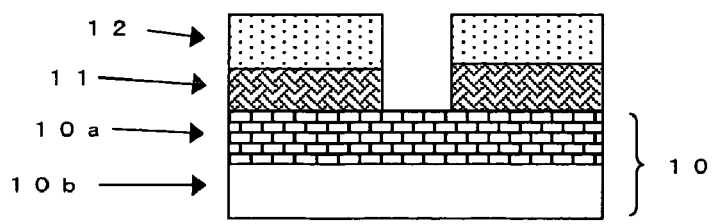
Figure 2:
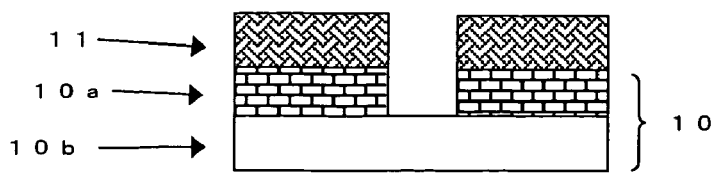

FIG. 2 is an explanatory view of one embodiment of a patterning process according to the present invention.

As shown in FIG. 1(c), the photoresist film 13 is formed again on the silicone resin film 12 by a rework process according to the present invention. Then, firstly, as shown in FIG. 2(a), pattern circuit areas are exposed, followed by post exposure baking (PEB) and development with a developer, and whereby a resist pattern is formed on the photoresist film 13.

Secondly, as shown in FIG. 2(b), the silicone resin film 12 is etched with using the patterned photoresist film 13 as a mask to transfer the resist pattern to the silicone resin film 12. Consequently, a pattern is formed on the silicone resin film 12.

In order to etch the silicone resin film 12 with using the photoresist film 13 as a mask, etching is performed by using flon gases, nitrogen gas, carbon dioxide gas, or the like. As for the silicone resin film 12, a film that is etched at a high etching rate by these gases and makes film loss of the photoresist film 13 over the silicone resin film small is preferably used.

Next, as shown in FIG. 2(c), the pattern formed on the silicone resin film 12 is transferred to the organic film 11 by oxygen plasma etching or the like to form a pattern on the organic film 11. At this time, the photoresist film 13 is also etched and removed. As a result, the silicone resin film 12 becomes the uppermost layer.

Incidentally, as for dry etching conditions, in addition to the method using oxygen-containing plasma, a method using hydrogen-nitrogen containing gas plasma and so on can also be used.

Then, as shown in FIG. 2(d), the process layer 10a on the base layer 10b is etched with using the patterned organic film 11 as a mask to transfer a pattern to the substrate 10. Consequently, the pattern is formed on the substrate 10.

For example, when the process layer 10a is made of silicon oxide, metal silicon or the like, dry etching conditions using fluorinated gas are preferably used. Use of dry etching conditions using fluorinated gas removes the silicone resin film 12 remaining on the organic film 11 while the substrate is etched. However, etching conditions are not limited thereto and any etching conditions used for monolayer resist methods can be used. For example, dry etching conditions using a chlorine gas can also be used.

After the pattern is formed on the substrate 10 with the above processes, the organic film 11 remaining on the substrate 10 can be removed, for example, by etching with oxygen plasma, hydrogen-nitrogen, and so on.

For example when deviation is generated in a resist pattern, according to the rework process of the present invention, the photoresist film is removed with a solvent while leaving the silicone resin film unremoved; a photoresist film is formed again over the silicone resin film; and subsequently a pattern is formed on the substrate as mentioned above. This makes it possible to prevent transferring a pattern down to a substrate with a deviated resist pattern. And also, a photoresist film can be reworked at low cost. Therefore time and manpower expended for producing the substrate are not wasted so much.

Figure 3:
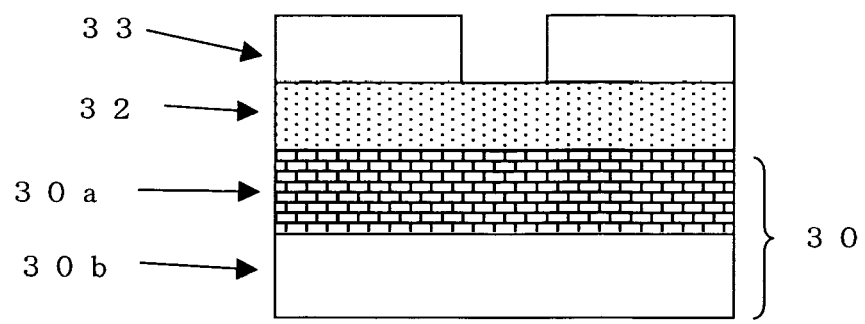
FIG. 3 is an explanatory view of another embodiment of a patterning process according to the present invention.
Figure 3:
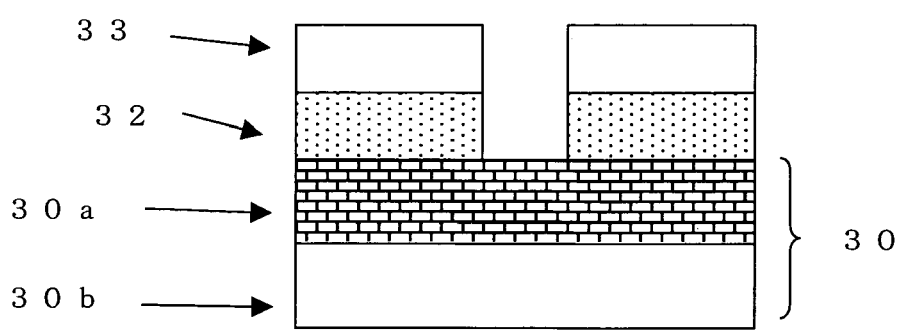
Figure 3:
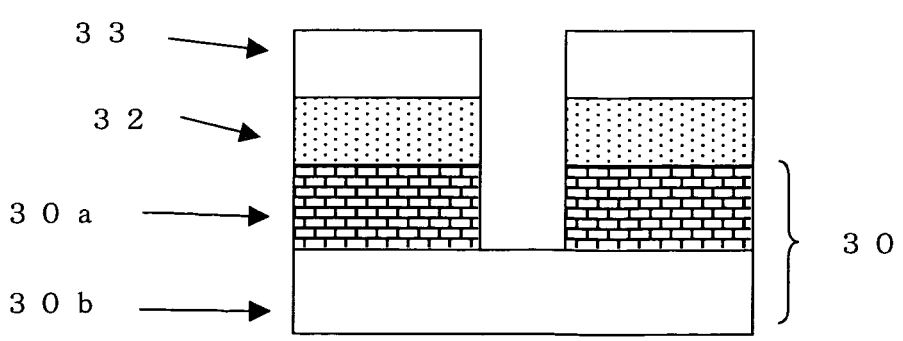

Next, another embodiment of a patterning process according to the present invention will be explained with referring to FIG. 3.

A substrate 30 has an antireflection silicone resin film 32, and a photoresist film 33 thereon, and does not have an organic film between the substrate 30 and the antireflection silicone resin film 32.

The photoresist film 33 is formed again on the silicone resin film 32 by the rework process for a photoresist film according to the present invention. Then, firstly, as shown in FIG. 3(a), pattern circuit areas are exposed, followed by post exposure baking (PEB) and development with a developer, and whereby a resist pattern is formed on the photoresist film 33.

Secondly, as shown in FIG. 3(b), the silicone resin film 32 is etched with using the photoresist film 33 on which the resist pattern is formed as a mask to transfer the resist pattern to the silicone resin film 32. Consequently, a pattern is formed on the silicone resin film 32.

In order to etch the silicone resin film 32 with using the photoresist film 33 on which the resist pattern is formed as a mask, etching is performed by using flon gases, nitrogen gas, carbon dioxide gas, or the like.

Next, as shown in FIG. 3(c), a pattern is transferred to the substrate 30 by etching the substrate 30 with using the patterned silicone resin film 32 as a mask. Consequently, the pattern is formed on the substrate 30. To etch the substrate 30 with using the patterned silicone resin film 32 as a mask, etching is carried out with a gas mainly containing fluorinated gas in the case that the process layer 30a over the base layer 30b is made of $SiO_2$ or SiN; etching is carried out with a gas mainly containing a chlorine gas or a bromine gas in the case that the process layer 30a is made of p-Si (p-type Si), Al or W. It is preferable that the silicone resin film 32 has a high etching resistance against chlorine or bromine. In particular, it is preferable that the silicone resin film 32 applicable as a hard mask when the process layer 30a is made of p-Si, Al or W. When the process layer 30a is a $SiO_2$ film or a SiN film, it is preferable that the silicone resin film 32 has a higher etching rate than the photoresist film 33, and a lower etching rate than the substrate 30, and can function as a hard mask.

When the process layer 30a of the substrate 30 is etched to form a pattern on the process layer 30a, the patterning process can be conducted with using the photoresist film 33 as a mask, or with using the patterned silicone resin film 32 as a mask.

EXAMPLE

Hereinafter, the present invention will be explained further in detail with reference to Examples and Comparative Example, however, the present invention is not limited thereto.

Example 1

[Preparation of Silicone Resin Film Composition]

In a 3000 ml glass flask, 1400 g of ethanol, 700 g of pure water, and 50 g of aqueous solution of 25 mass % tetramethylammonium hydroxide were placed, and stirred. To this mixture, a mixture of 139 g of 2-(3,4-epoxycyclohexyl) ethyl trimethoxy silane and 32 g of phenyl trimethoxy silane was added dropwise at a liquid temperature of 40 degrees C. After that, the solution was stirred for 2 hours at 40 degrees C. After the reaction finished, the reaction was quenched by adding 35 g of acetic acid, and ethanol was removed under a reduced pressure. To thus-obtained solution, 2000 ml of ethyl acetate was added and a water layer was separated. An organic layer was washed twice with ultrapure water. To this contents, 600 g of propylene glycol monomethyl ether acetate (PGMEA) was added, and the contents were heated up to a liquid temperature of 40 degrees C. under a reduced pressure to give Polymer 1.

Mass-average molecular weight (Mw) (relative to polystyrene standard) of Polymer 1 was obtained by gel permeation chromatography (GPC). And a copolymerization ratio of Polymer 1 was obtained by $^{13}$C-NMR. The results are shown below.

Then, a ratio of end groups was measured with $^{29}$Si-NMR and A was calculated. A was 3.2%. A ratio of Si—OH/Si—OR was calculated with $^{13}$C-NMR and Si—OH/Si—OR was 100/0.

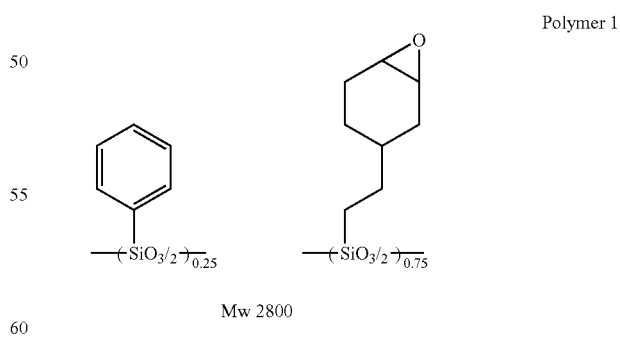

Polymer 1

Mw 2800

Then, thus-synthesized Polymer 1 was dissolved with a ratio of 100 parts by mass of Polymer 1; 2000 parts by mass of an organic solvent; 0.3 parts by mass of an acid generator; and 0.5 parts by mass of a surfactant. Then, the contents were filtered with a 0.1 μm fluoroplastic filter to prepare silicone resin film composition.

Each component in the silicone resin film composition is as follows.

Organic Solvent: PGMEA (propylene glycol monomethyl ether acetate) Acid Generator: AG1 (see the following structural formula)

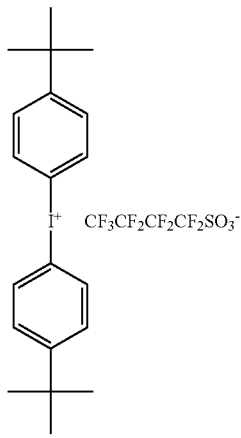

AG1

Surfactant: FC-430 (manufactured by Sumitomo 3M)

[Preparation of Photoresist Film Composition]

A photoresist film composition to be exposed with ArF excimer laser was prepared by dissolving the following resin, photo acid generator and basic additive in an organic solvent containing 0.1 mass % of FC-430 (manufactured by Sumitomo 3M), and filtering them with a 0.1 μm fluoroplastic filter.

Resin: 10 parts by mass of Polymer 2 (see the following structural formula)

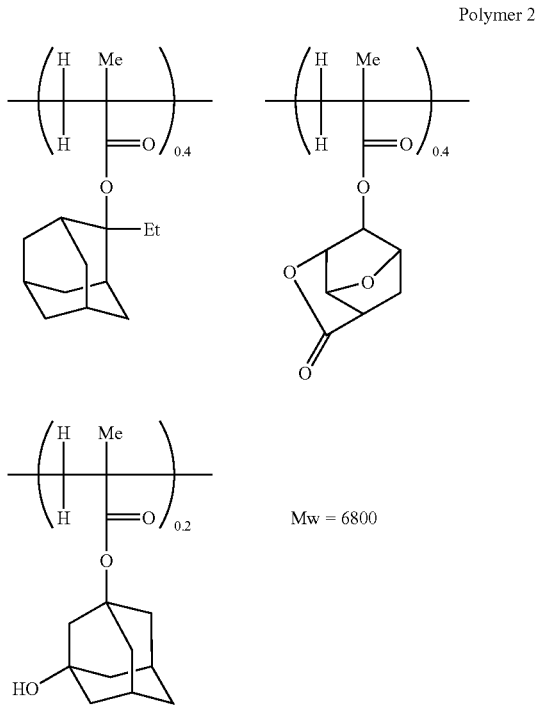

Polymer 2

Mw = 6800

Photo Acid Generator: 0.2 parts by mass of triphenyl sulfonium nonafluoro butane sulfonate Basic Additive: 0.02 parts by mass of triethanolamine Organic Solvent: 200 parts by mass of PGMEA (propylene glycol monomethyl ether acetate)

[Preparation of Organic Film Composition]

As an organic film composition, 4,4'-(9H—fluorene-9-ylidene) bisphenol-novolac resin (molecular weight: 11000) containing composition (28 parts by mass of resin and 100 parts by mass of solvent) was prepared.

[Patterning]

First, the organic film composition prepared above was spin-coated on a substrate, and was heated at 200 degrees C. for 1 minute to form an organic film with a thickness of 300 nm.

Second, the silicone resin film composition prepared above was spin-coated on the organic film, and was baked for 60 seconds at 180 degrees C. to form a silicone resin film with a thickness of 100 nm.

Furthermore, the photoresist film composition prepared above was applied on the silicone resin film, and was baked for 60 seconds at 130 degrees C. to form a photoresist film with a thickness of 200 nm.

In this way, a substrate having the organic film, the antireflection silicone resin film thereon and the photoresist film thereon was prepared.

Subsequently, it was exposed with the ArF exposure system (S305B, NAO.68, σ0.85, ⅔ annular illumination, a Cr mask, manufactured by Nikon Corporation), was baked (PEB) for 90 seconds at 110 degrees C., and was developed in 2.38 mass % aqueous solution of tetra methyl ammonium hydroxide (TMAH), to obtain a positive resist pattern.

The resist patterns with 90 nm L/S were observed and some patterns were out of spec in their pattern sizes.

At this moment, patterns having pattern sizes within spec were observed to detect the presence or absence of footing profile, undercut, and intermixing phenomenon in the vicinity of the silicone resin films. As a result, no footing profile, undercut, and intermixing phenomenon were found, and it was confirmed that resist pattern profiles of those were excellent.

Next, substrates having out-of-spec pattern size were drawn, and each photoresist film thereof was removed with a solvent while leaving the silicone resin film unremoved. The solvent used at this moment contains 70 mass % of propylene glycol methyl ether and 30 mass % of cyclohexanone.

Again, the photoresist film composition prepared above was applied on the silicone resin film, and was baked for 60 seconds at 130 degrees C. to form a photoresist film with a thickness of 200 nm.

It is not necessary to remove the silicone resin film. Consequently, the photoresist film was reworked easily at low cost.

After that, a resist pattern was formed on the reworked photoresist film as with above.

Thus-obtained resist patterns were observed and every pattern size was within spec this time.

Then, the patterns were observed to detect the presence or absence of footing profile, undercut, and intermixing phenomenon in the vicinity of the silicone resin film. As a result, no footing profile, undercut, and intermixing phenomenon were found, and it was confirmed that both the resist pattern profiles before and after reworking were excellent.

Next, the silicone resin film was etched with dry etching conditions under which the silicone resin film has a sufficiently higher etching rate than organic compositions with using the resist pattern as an etching mask.

A dry-etching-system TE-8500P manufactured by Tokyo Electron, Ltd. was used, and the etching conditions were as follows.
Chamber pressure: 40 Pa
RF power: 1,300 W
gap: 9 mm
$CHF_3$ gas flow rate: 30 ml/min
$CF_4$ gas flow rate: 30 ml/min
Ar gas flow rate: 100 ml/min The antireflection silicone resin film was etched by the dry etching to form a pattern on the antireflection silicone resin film while resist pattern deformation due to side etching of the photoresist film hardly influenced the pattern.

After that, the substrate having the silicone resin film to which the pattern is transferred as mentioned above was etched with dry etching conditions under which the bottom organic film has sufficiently higher etching rate than the silicone resin film.

The etching was conducted by reactive dry etching with oxygen plasma, and the etching conditions were as follows.
Chamber pressure: 60 Pa
RF power: 600 W
Ar gas flow rate: 40 sccm
$O_2$ gas flow rate: 60 sccm
gap: 9 mm By the reactive dry etching, the exposed pattern obtained as the resist pattern was transferred to the bottom organic film precisely.

Subsequently, the substrate was etched with using the pattern-transferred organic film as an etching mask to form a pattern on the substrate. At this time, because the process layer of the substrate was made of silicon oxide, dry etching conditions using fluorinated gas was used. With the dry etching conditions, the process layer of the substrate was etched and the antireflection silicone resin film on the organic film was also etched and removed.

After that, the organic film remaining on the substrate was removed by oxygen gas plasma etching.

The patterns formed on the substrates were observed and it was confirmed that excellent patterns were formed.

Example 2

Reworking a photoresist film, forming a resist pattern, forming a pattern on a substrate, and so on were conducted as with Example 1 except that a solvent containing 30 mass % of propylene glycol methyl ether, 40 mass % of cyclohexanone, and 30 mass % of 4-hydroxy-4-methyl-2-pentanone was used as a solvent for removing the photoresist film to rework the photoresist film instead of the solvent of Example 1 containing 70 mass % of propylene glycol methyl ether and 30 mass % of cyclohexanone.

It is not necessary to remove the silicone resin film when the photoresist film is reworked. Consequently, the photoresist film was reworked easily at low cost.

Thus-obtained resist patterns were observed and no footing profile, undercut, and intermixing phenomenon were found, and it was confirmed that both the resist pattern profiles before and after reworking were excellent.

The patterns formed on the substrates were observed and it was confirmed that excellent patterns were formed.

Example 3

Reworking a photoresist film, forming a resist pattern, forming a pattern on a substrate, and so on were conducted as with Example 1 except that a solvent containing 30 mass % of propylene glycol methyl ether, 40 mass % of cyclohexanone, and 30 mass % of ethyl lactate was used as a solvent for removing the photoresist film to rework the photoresist film instead of the solvent of Example 1 containing 70 mass % of propylene glycol methyl ether and 30 mass % of cyclohexanone.

It is not necessary to remove the silicone resin film when the photoresist film is reworked. Consequently, the photoresist film was reworked easily at low cost.

Thus-obtained resist patterns were observed and no footing profile, undercut, and intermixing phenomenon were found, and it was confirmed that both the resist pattern profiles before and after reworking were excellent.

The patterns formed on the substrates were observed and it was confirmed that excellent patterns were formed.

Example 4

Reworking a photoresist film, forming a resist pattern, forming a pattern on a substrate, and so on were conducted as with Example 1 except that a solvent containing 70 mass % of propylene glycol methyl ether acetate, and 30 mass % of cyclohexanone was used as a solvent for removing the photoresist film to rework the photoresist film instead of the solvent of Example 1 containing 70 mass % of propylene glycol methyl ether and 30 mass % of cyclohexanone.

It is not necessary to remove the silicone resin film when the photoresist film is reworked. Consequently, the photoresist film was reworked easily at low cost.

Thus-obtained resist patterns were observed and no footing profile, undercut, and intermixing phenomenon were found, and it was confirmed that both the resist pattern profiles before and after reworking were excellent.

The patterns formed on the substrates were observed and it was confirmed that excellent patterns were formed.

Comparative Example 1

ARC29A, which is a commercially available antireflection resin film composition, is not silicone resin and is manufactured by Brewer Science, was spin-coated on a substrate, and was baked for 60 seconds at 200 degrees C. to form an antireflection film with a thickness of 80 nm. ARC29A has conventionally used for forming an antireflection resin film for ArF photoresist.

Then, the same photoresist film composition as Example 1 was applied on the antireflection film, and was baked for 60 seconds at 130 degrees C. to form a photoresist film with a thickness of 200 nm.

In this way, a substrate having the antireflection film, and the photoresist film thereon was prepared.

Subsequently, it was exposed with the ArF exposure system (S305B, NA0.68, σ0.85, ⅔ annular illumination, a Cr mask, manufactured by Nikon Corporation), was baked (PEB) for 90 seconds at 110 degrees C., and was developed in 2.38 mass % aqueous solution of tetra methyl ammonium hydroxide (TMAH), to obtain a positive resist pattern.

Thus-obtained resist patterns with 90 nm L/S were observed and some patterns were out of spec in their pattern sizes.

Next, substrates having out-of-spec pattern size were drawn, and both the antireflection films and the photoresist films on the substrates were removed.

After that, an antireflection film and a photoresist film were formed again on each substrate.

This method was cumbersome and cost much because even the antireflection film was removed to rework the photoresist film.

Separately, some substrates having out-of-spec pattern size were further drawn, and only the photoresist film of each substrate was removed with cyclohexanone.

Then, a photoresist film was formed again on the antireflection film.

Subsequently, a resist pattern was formed on the reworked photoresist film as with above.

Profiles of thus-obtained resist patterns were observed and terrible footing was found in the vicinity of the antireflection film.

In summary, it has been found that it is necessary to remove both the antireflection film and the photoresist film to form a good pattern on a substrate with an antireflection film formed with ARC29.

The present invention is not limited to the above-described embodiments. The above-described embodiments are mere examples, and those having the substantially same structure as that described in the appended claims and providing the similar action and advantages are included in the scope of the present invention.

What is claimed is:

1. A rework process for a photoresist film over a substrate having at least an antireflection silicone resin film and the photoresist film over the silicone resin film comprising: at least
   removing the photoresist film with a solvent while leaving the silicone resin film unremoved; and
   forming a photoresist film again directly on the silicone resin film.

2. The rework process for a photoresist film according to claim 1, wherein the antireflection silicone resin film has cross-links between side chains of the silicone resin, between a side chain and a silanol group of the silicone resin, or both between side chains of the silicone resin and between a side chain and a silanol group of the silicone resin.

3. The rework process for a photoresist film according to claim 2, wherein the silicone resin film has the cross-links formed by any one or more of a crosslinkable hydroxy group and a crosslinkable epoxy group in a side chain of the silicone resin.

4. The rework process for a photoresist film according to claim 1, wherein the solvent for removing the photoresist film contains 50 mass % or more of a compound selected from the group consisting of a propylene glycol alkyl ether derivative and a saturated alkyl ketone having 5 or more carbon atoms; or 50 mass % or more in total of two or more compounds selected from the group consisting of a propylene glycol alkyl ether derivative and a saturated alkyl ketone having 5 or more carbon atoms.

5. The rework process for a photoresist film according to claim 2, wherein the solvent for removing the photoresist film contains 50 mass % or more of a compound selected from the group consisting of a propylene glycol alkyl ether derivative and a saturated alkyl ketone having 5 or more carbon atoms; or 50 mass % or more in total of two or more compounds selected from the group consisting of a propylene glycol alkyl ether derivative and a saturated alkyl ketone having 5 or more carbon atoms.

6. The rework process for a photoresist film according to claim 3, wherein the solvent for removing the photoresist film contains 50 mass % or more of a compound selected from the group consisting of a propylene glycol alkyl ether derivative and a saturated alkyl ketone having 5 or more carbon atoms; or 50 mass % or more in total of two or more compounds selected from the group consisting of a propylene glycol alkyl ether derivative and a saturated alkyl ketone having 5 or more carbon atoms.

7. The rework process for a photoresist film according to claim 4, wherein the propylene glycol alkyl ether derivative is any one or more compound(s) selected from the group consisting of propylene glycol methyl ether and propylene glycol methyl ether acetate.

8. The rework process for a photoresist film according to claim 5, wherein the propylene glycol alkyl ether derivative is any one or more compound(s) selected from the group consisting of propylene glycol methyl ether and propylene glycol methyl ether acetate.

9. The rework process for a photoresist film according to claim 6, wherein the propylene glycol alkyl ether derivative is any one or more compound(s) selected from the group consisting of propylene glycol methyl ether and propylene glycol methyl ether acetate.

10. The rework process for a photoresist film according to claim 4, wherein the saturated alkyl ketone having 5 or more carbon atoms is any one or more compound(s) selected from the group consisting of cyclopentanone, cyclohexanone, and 5-methyl-2-hexanone.

11. The rework process for a photoresist film according to claim 5, wherein the saturated alkyl ketone having 5 or more carbon atoms is any one or more compound(s) selected from the group consisting of cyclopentanone, cyclohexanone, and 5-methyl-2-hexanone.

12. The rework process for a photoresist film according to claim 6, wherein the saturated alkyl ketone having 5 or more carbon atoms is any one or more compound(s) selected from the group consisting of cyclopentanone, cyclohexanone, and 5-methyl-2-hexanone.

13. The rework process for a photoresist film according to claim 7, wherein the saturated alkyl ketone having 5 or more carbon atoms is any one or more compound(s) selected from the group consisting of cyclopentanone, cyclohexanone, and 5-methyl-2-hexanone.

14. The rework process for a photoresist film according to claim 8, wherein the saturated alkyl ketone having 5 or more carbon atoms is any one or more compound(s) selected from the group consisting of cyclopentanone, cyclohexanone, and 5-methyl-2-hexanone.

15. The rework process for a photoresist film according to claim 9, wherein the saturated alkyl ketone having 5 or more carbon atoms is any one or more compound(s) selected from the group consisting of cyclopentanone, cyclohexanone, and 5-methyl-2-hexanone.

16. The rework process for a photoresist film according to claim 1, wherein the substrate over which the photoresist film is reworked has an organic film under the silicone resin film.

17. The rework process for a photoresist film according to claim 15, wherein the substrate over which the photoresist film is reworked has an organic film under the silicone resin film.

18. A patterning process comprising: at least forming a photoresist film again over the silicone resin film by the rework process according to claim 1;
   subsequently forming a resist pattern on the photoresist film;
   forming a pattern on the silicone resin film by using the photoresist film on which the resist pattern is formed as a mask; and
   forming a pattern on the substrate by using the pattern-formed silicone resin film as a mask.

19. A patterning process comprising: at least forming a photoresist film again over the silicone resin film by the rework process according to claim 15;
- subsequently forming a resist pattern on the photoresist film;
- forming a pattern on the silicone resin film by using the photoresist film on which the resist pattern is formed as a mask; and
- forming a pattern on the substrate by using the pattern-formed silicone resin film as a mask.

20. A patterning process comprising: at least
- forming a photoresist film again over the silicone resin film by the rework process according to claim 16;
- subsequently forming a resist pattern on the photoresist film;
- forming a pattern on the silicone resin film by using the photoresist film on which the resist pattern is formed as a mask;
- forming a pattern on the organic film by using the pattern-formed silicone resin film as a mask; and
- forming a pattern on the substrate by using the pattern-formed organic film as a mask.

21. A patterning process comprising: at least forming a photoresist film again over the silicone resin film by the rework process according to claim 17;
- subsequently forming a resist pattern on the photoresist film;
- forming a pattern on the silicone resin film by using the photoresist film on which the resist pattern is formed as a mask;
- forming a pattern on the organic film by using the pattern-formed silicone resin film as a mask; and
- forming a pattern on the substrate by using the pattern-formed organic film as a mask.

* * * * *